United States Patent
Toba

(10) Patent No.: US 8,143,122 B2
(45) Date of Patent: Mar. 27, 2012

(54) NONVOLATILE SEMICONDUCTOR MEMORY AND METHOD OF MANUFACTURING THE SAME

(75) Inventor: Takayuki Toba, Yokohama (JP)

(73) Assignee: Kabushiki Kaisha Tohiba, Tokyo (JP)

(*) Notice: Subject to any disclaimer, the term of this patent is extended or adjusted under 35 U.S.C. 154(b) by 60 days.

(21) Appl. No.: 12/781,554

(22) Filed: May 17, 2010

(65) Prior Publication Data
US 2010/0227468 A1   Sep. 9, 2010

Related U.S. Application Data

(63) Continuation of application No. 11/616,167, filed on Dec. 26, 2006, now abandoned.

(30) Foreign Application Priority Data

Dec. 27, 2005 (JP) ................................. 2005-376518

(51) Int. Cl.
*H01L 21/336* (2006.01)
(52) U.S. Cl. ........ 438/257; 438/260; 438/261; 438/266; 257/E21.179; 257/E21.68
(58) Field of Classification Search .................. 438/257, 438/260, 261, 266; 257/E21.179, E21.68
See application file for complete search history.

(56) References Cited

U.S. PATENT DOCUMENTS

| | | | |
|---|---|---|---|
| 5,173,436 A | 12/1992 | Gill et al. | |
| 5,329,487 A | 7/1994 | Gupta et al. | |
| 5,595,920 A * | 1/1997 | Miyawaki et al. | 438/297 |
| 6,555,434 B2 | 4/2003 | Koh | |
| 6,818,505 B2 | 11/2004 | Tsuji | |
| 7,948,038 B2 * | 5/2011 | Yaegashi et al. | 257/396 |
| 2001/0005330 A1 | 6/2001 | Choi | |
| 2002/0008278 A1 * | 1/2002 | Mori | 257/315 |
| 2005/0062096 A1 * | 3/2005 | Sasago et al. | 257/321 |
| 2005/0285180 A1 | 12/2005 | Mitani et al. | |
| 2006/0051926 A1 * | 3/2006 | Jeong et al. | 438/296 |
| 2006/0140028 A1 | 6/2006 | Mizushima et al. | |
| 2008/0073690 A1 | 3/2008 | Baek et al. | |
| 2008/0121970 A1 | 5/2008 | Aritome | |
| 2008/0303079 A1 | 12/2008 | Cho et al. | |
| 2009/0309151 A1 | 12/2009 | Sandhu et al. | |
| 2011/0220982 A1 * | 9/2011 | Yaegashi et al. | 257/316 |

FOREIGN PATENT DOCUMENTS

| | | |
|---|---|---|
| JP | 2000-195972 | 7/2000 |
| JP | 2003-501838 | 1/2003 |
| JP | 2003-229499 | 8/2003 |

* cited by examiner

*Primary Examiner* — Ngan Ngo
(74) *Attorney, Agent, or Firm* — Oblon, Spivak, McClelland, Maier & Neustadt, L.L.P.

(57) ABSTRACT

A nonvolatile semiconductor memory includes a first and a second diffusion layer regions, a floating gate electrode disposed, with a gate insulating film interposed therebetween, on a channel region between the first and second diffusion layer regions, and a control gate electrode serving as a word line and disposed on the floating gate electrode with an interelectrode insulating film interposed therebetween. The interelectrode insulating film covers whole side portions of the floating gate electrode located in a direction different from a direction in which the word line extends, and the control gate electrode covers the side portions of the floating gate electrode located in the direction different from the direction in which the word line extends.

3 Claims, 30 Drawing Sheets

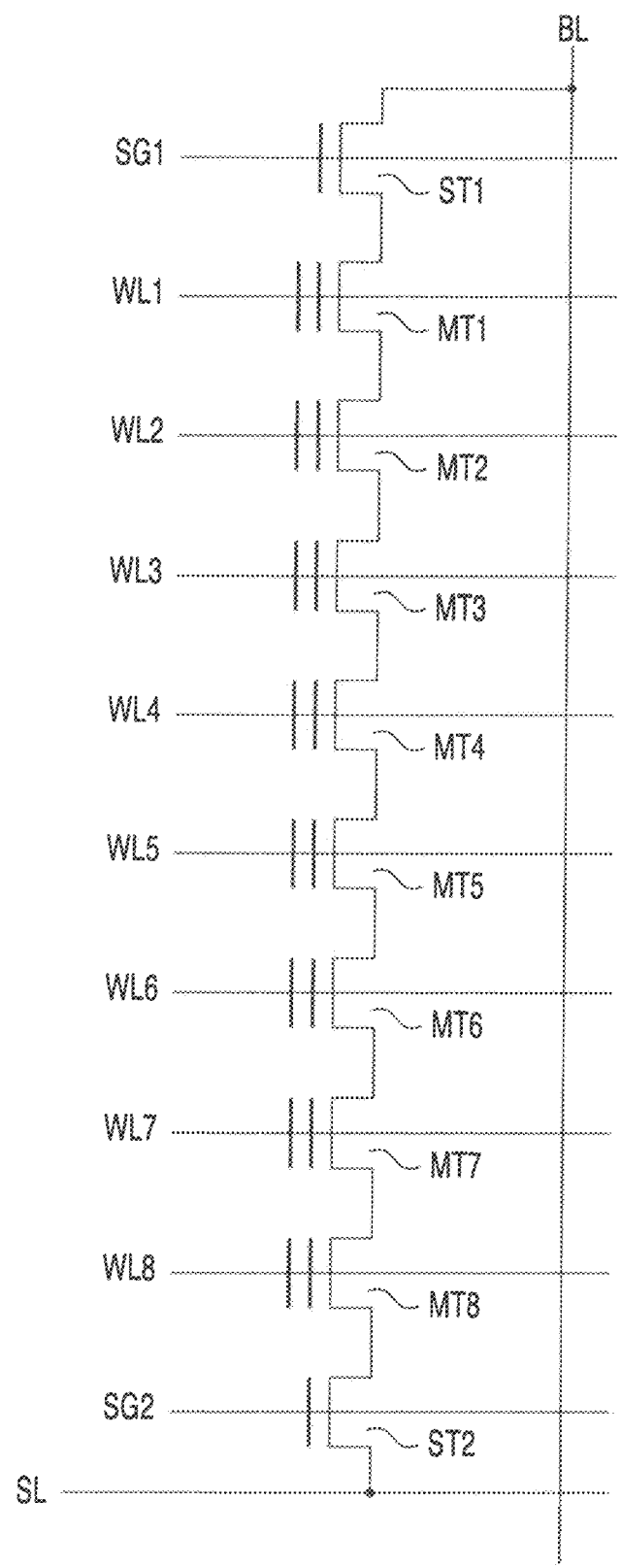
F I G. 3 4

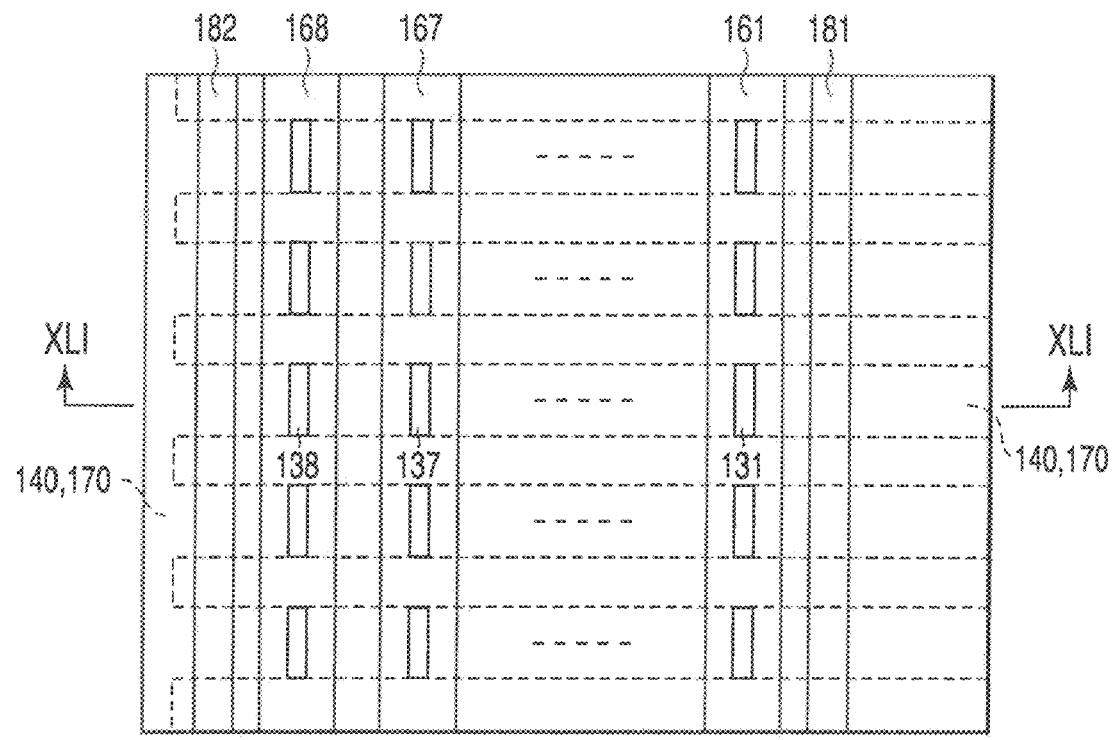
F I G. 41 A
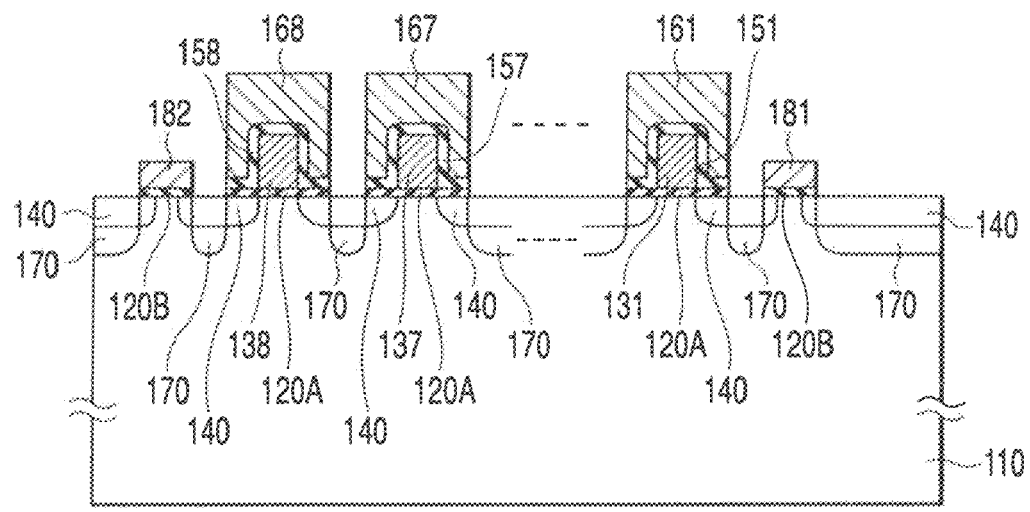
F I G. 41 B

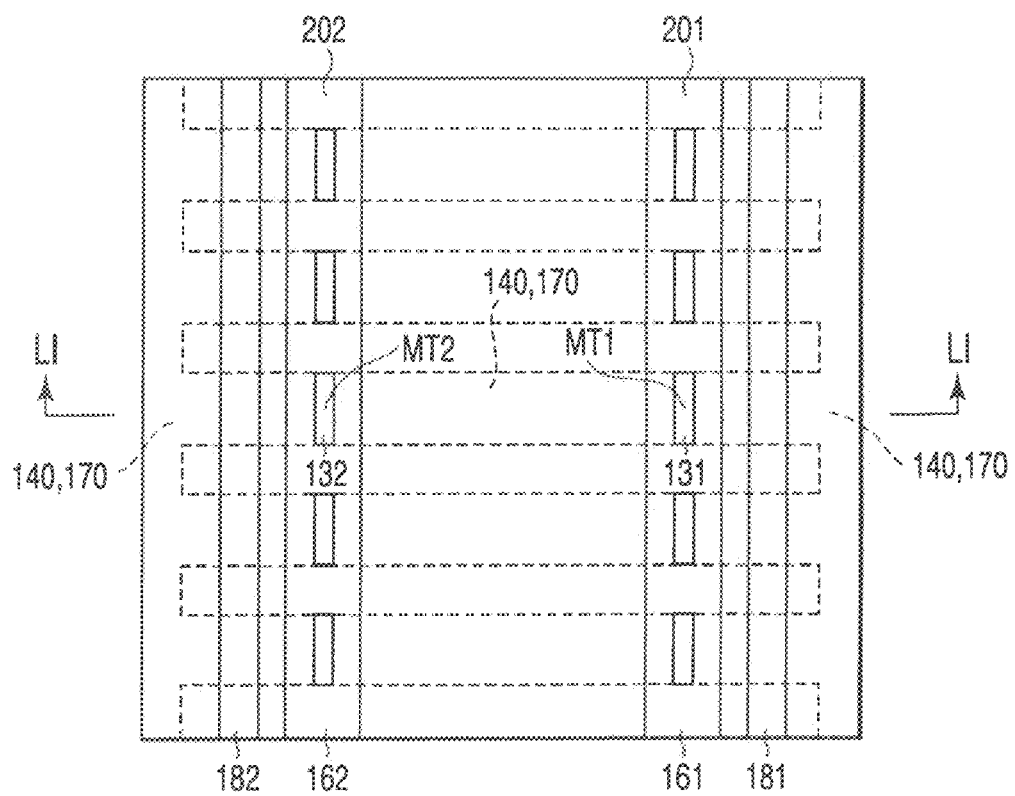
F I G. 51A
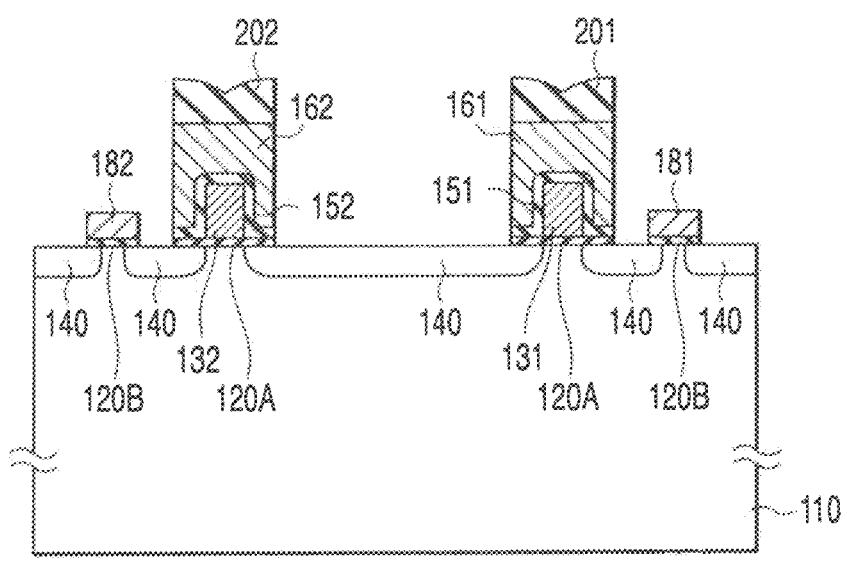
F I G. 51B

NONVOLATILE SEMICONDUCTOR MEMORY AND METHOD OF MANUFACTURING THE SAME

CROSS-REFERENCE TO RELATED APPLICATIONS

This application is a continuation of U.S. application Ser. No. 11/616,167, filed Dec. 26, 2006, and is based upon and claims the benefit of priority from prior Japanese Patent Application No. 2005-376518, filed Dec. 27, 2005, the entire contents of each of which are incorporated herein by reference.

BACKGROUND OF THE INVENTION

1. Field of the Invention

The present invention relates to a nonvolatile semiconductor memory and a method of manufacturing the same.

2. Description of the Related Art

As nonvolatile semiconductor memory, widely used are NAND or NOR flash memories formed of memory cell transistors having a stacked gate structure, in which a floating gate electrode and a control gate electrode are stacked.

In recent years, there is an increasing demand for LSIs including different functions and called System On Chip, in which these flash memories and logic circuits and the like are combined on a single chip.

In incorporating flash memories in LSIs, it is required to shorten the write/erase time of flash memories for high-speed operation of LSIs.

As one solution thereof, it is considered to improve the coupling ratio of memory cell transistors.

BRIEF SUMMARY OF THE INVENTION

A nonvolatile semiconductor memory of an aspect of the present invention comprises a first and a second diffusion layer regions, a floating gate electrode disposed, with a gate insulating film interposed therebetween, on a channel region between the first and second diffusion layer regions, and a control gate electrode disposed on the floating gate electrode with an interelectrode insulating film interposed therebetween, the control gate electrode serving as a word line. The interelectrode insulating film covers whole side portions of the floating gate electrode, the control gate electrode covers the side portions of the floating gate electrode. The side portions are located in a direction different from a direction in which the word line extends.

A method of manufacturing a nonvolatile semiconductor memory of an aspect of the present invention comprises forming a pattern of a floating gate electrode, forming an interelectrode insulating film covering a surface of the floating gate electrode, forming an underlayer on the interelectrode insulating film, the underlayer having a bulging portion above the floating gate electrode, forming a first mask layer on the underlayer, flattening the bulging portion, forming a pattern of the first mask layer in a self-alignment manner, the pattern of the first mask layer having a first opening above the floating gate electrode, forming a second opening by etching the underlayer, with the first mask layer used as a mask, until the interelectrode insulating film is exposed, forming a conductive film on the interelectrode insulating film exposed in the second opening, the conductive film having a depressed portion above the floating gate electrode, forming a second mask layer on the conductive film, forming a pattern of the second mask layer in the depressed portion in a self-alignment manner, by etching the second mask layer, and forming a control gate electrode by etching the conductive film, with the second mask layer used as a mask.

A method of manufacturing a nonvolatile semiconductor memory of an aspect of the present invention comprises forming a pattern of a floating gate electrode, forming an interelectrode insulating film covering a surface of the floating gate electrode, forming a conductive film on the interelectrode insulating film, forming an underlayer on the conductive film, the underlayer having a bulging portion above the floating gate electrode, forming a first mask layer on the underlayer, flattening the bulging portion, and forming a pattern of the first mask layer in a self-alignment manner, the pattern of the first mask layer having a first opening above the floating gate electrode, forming a second opening by etching the underlayer, with the first mask layer used as a mask, until the conductive film is exposed, forming a second mask layer on the conductive film exposed in the second opening, forming a pattern of the second mask layer in the second opening in a self-alignment manner, by etching the second mask layer, and forming a control gate electrode by etching the underlayer and the conductive film, with the second mask layer used as a mask.

A method of manufacturing a nonvolatile semiconductor memory of an aspect of the present invention comprises forming a stacked gate electrode of a memory cell transistor, forming a conductive film covering the stacked gate electrode of the memory cell transistor, forming a mask layer on the conductive film, forming a pattern of the mask layer in a self-alignment manner by etching the mask layer, the pattern of the mask layer being adjacent to the conductive film located on side portions of the stacked gate electrode of the memory cell transistor, and forming a gate electrode of a select transistor by etching the conductive film with the mask layer used as a mask.

BRIEF DESCRIPTION OF THE SEVERAL VIEWS OF THE DRAWING

FIG. 34 is a diagram illustrating an equivalent circuit of a NAND flash memory being a first applied example of the present invention.

FIG. 41A is a plan view of a step of the manufacturing process according to the first applied example.

FIG. 41B is a cross-sectional view of the step shown in FIG. 41A of the manufacturing process according to the first applied example.

FIG. 51A is a plan view of a step of the manufacturing process according to the second applied example.

FIG. 51B is a cross-sectional view of the step shown in FIG. 51A of the manufacturing process according to the second applied example.

DETAILED DESCRIPTION OF THE INVENTION

A mode for carrying out embodiments of the present invention is described in detail with reference to drawings.

1. Outline

A nonvolatile semiconductor memory according to the present invention has a feature that side portions of a floating gate electrode, located in a direction different from an extending direction of a control gate electrode (word line), that is, in an extending direction of a bit line are covered with the control gate electrode.

A direction parallel to a channel length of a memory cell transistor is defined as "channel length direction", and a direction parallel to a channel width is defined as "channel width direction".

In this case, the control gate electrode of a memory cell transistor extends in the channel width direction, and covers side portions the floating gate electrode, which are located in the channel length direction.

Further, if an interelectrode insulating film between the floating gate electrode and the control gate electrode adopts a structure of covering the whole side portions of the floating gate electrode located in the extending direction of the bit lines, the control gate electrode covers side portions of the floating gate electrode, which are located in the extending direction of the bit line to the maximum extent, and thus the coupling ratio of the memory cell transistor is greatly improved.

Further, according to the present invention, there is provided a method of making the nonvolatile semiconductor memory by a self-alignment method. This method secures sufficient alignment accuracy even in fine memory transistors, and improves manufacturing yield.

2. Embodiments

Next, some preferred embodiments are explained below.
The definitions of the channel length direction and the channel width direction of memory cell transistors are as explained in the above section "Outline".

(1) Structure

A structure of a memory cell transistor is explained with reference to FIGS. 1 to 6.

In this example, explained is a memory cell transistor, the channel length direction of which is an extending direction of bit lines, and the channel width direction of which is an extending direction of the control gate electrode (word line).

Figure 1:
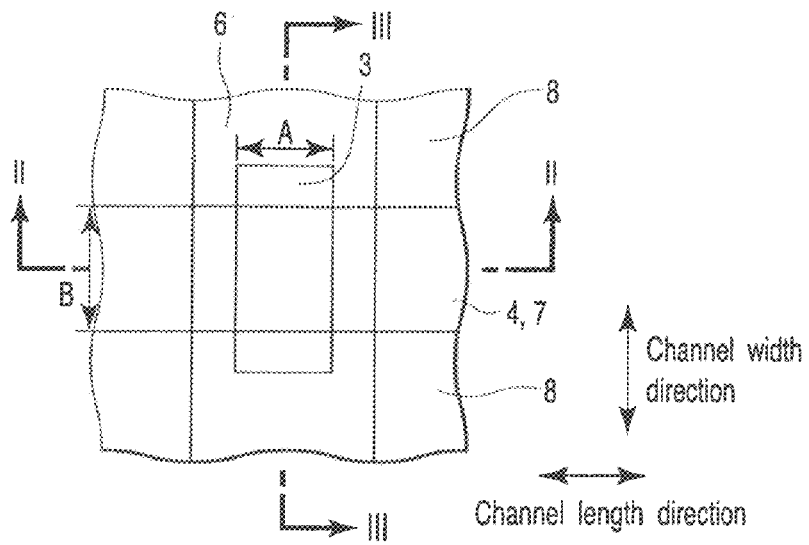
FIG. 1 is a plan view of a structure of a nonvolatile semiconductor memory according to an embodiment of the present invention.
Figure 2:
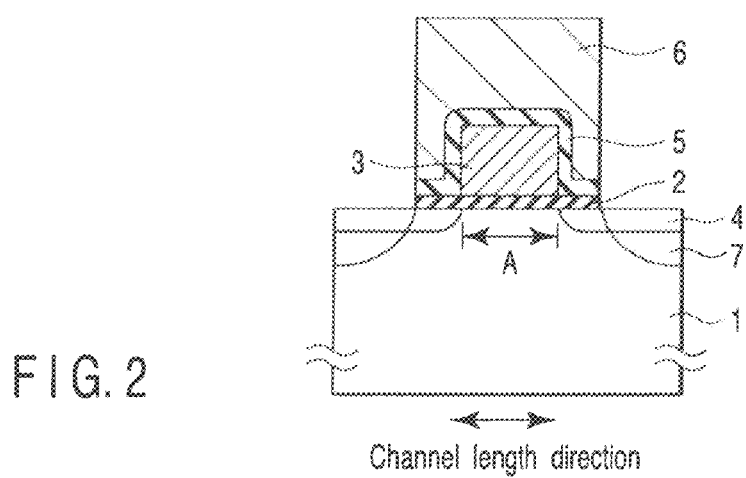
FIG. 2 is a cross-sectional view taken along line II-II of FIG. 1.
Figure 3:
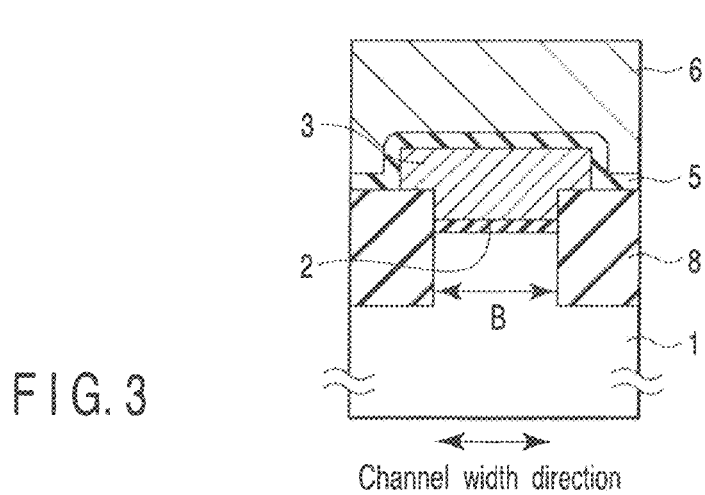
FIG. 3 is a cross-sectional view taken along line III-III of FIG. 1.

FIG. 1 is a plan view of the memory cell transistor, FIG. 2 illustrates a cross section taken along line II-II of FIG. 2, and FIG. 3 illustrates a cross section taken along line III-III of FIG. 3.

A floating gate electrode 3 of the memory cell transistor is formed on a gate insulating film (tunnel insulating film) 2 on a surface of a semiconductor substrate 1. An upper portion of the floating gate electrode 3 and the whole side portions of the floating gate electrode 3, which are located in the channel length direction parallel to the channel length A are covered with an interelectrode insulating film 5. Further, an upper portion and side portions located in the channel length direction of the interelectrode insulating film 5 are covered with a control gate electrode 6. The interelectrode insulating film 5 is in contact with the gate insulating film 2. Further, shallow diffusion layer regions (LDD regions) 4 and deep diffusion layer regions (source/drain regions) 7 are formed in the surface of the semiconductor substrate 1.

This structure is realized by separately processing the floating gate electrode 3 and the control gate electrode 6. This is because the floating gate electrode 3 and the control gate electrode 6 are generally processed simultaneously, and side portions of the floating gate electrode 3 located in a direction different from an extending direction of the control gate electrode 6, that is, in the channel length direction cannot be covered with the control gate electrode 6. However, forming the floating gate electrode 3 and the control gate electrode 6 separately complicates the process and increases the manufacturing cost. Therefore, in the embodiment, the above structure is manufactured by a self-alignment method to solve the problem.

As described above, according to the structure of the embodiment, an overlap area of the control gate electrode 6 is secured also for side portions of the floating gate electrode 3, which are located in the channel length direction and thus the coupling ratio is improved.

Further, as shown in FIG. 3, side portions of the floating gate electrode 3 located in the channel width direction parallel to the channel width B of the floating gate electrode 3, and thereby the coupling ratio is further improved.

Figure 4:
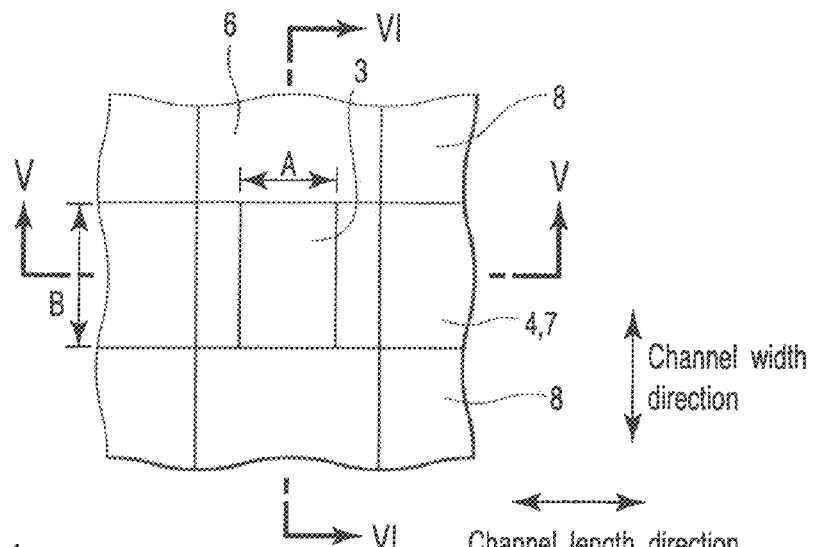
FIG. 4 is a plan view of a structure of a nonvolatile semiconductor memory according to an embodiment of the present invention.
Figure 5:
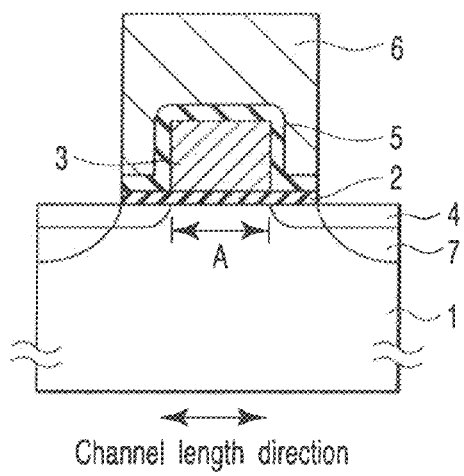
FIG. 5 is a cross-sectional view taken along line V-V of FIG. 4.
Figure 6:
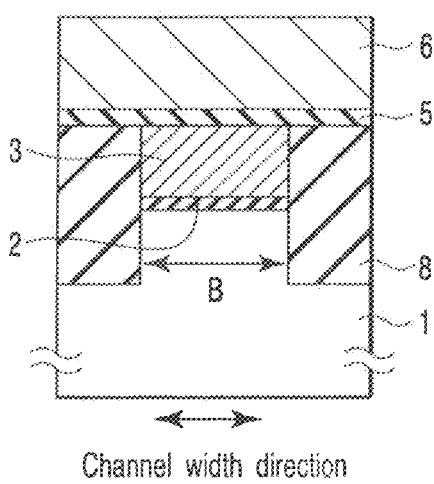
FIG. 6 is a cross-sectional view taken along line VI-VI of FIG. 4.

Furthermore, as shown in FIGS. 4 to 6, the upper end of the floating gate electrode 3 is aligned with the upper end of a device isolation insulating layer 8. This structure contributes to microfabrication of the memory cell transistor.

The following is explanation of a manufacturing method of the memory cell transistor according to the embodiment of the present invention having the above structure.

2) Manufacturing Method (i) First Manufacturing Method

A first manufacturing method of the memory cell transistor illustrated in FIGS. 1 to 6 is explained with reference to FIGS. 7 to 20. FIGS. 7 to 20 are diagrams illustrating a manufacturing process of the first manufacturing method of the memory cell transistor, illustrating a cross section in the channel length direction thereof.

Figure 7:
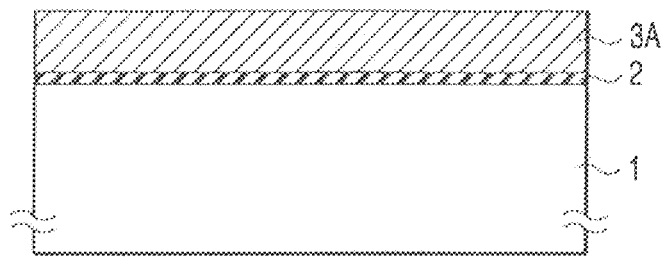
FIG. 7 is a cross-sectional view taken in a channel length direction and illustrating a step of a manufacturing process according to a first manufacturing method of the present invention.

First, as shown in FIG. 7, a gate insulating film (tunnel insulating film) 2 is formed on a semiconductor substrate 1 by, for example, thermal oxidation. Thereafter, a polycrystalline silicon film 3A serving as a floating gate electrode is formed on the gate insulating film 2 by, for example, CVD (Chemical Vapor Deposition).

Figure 8:
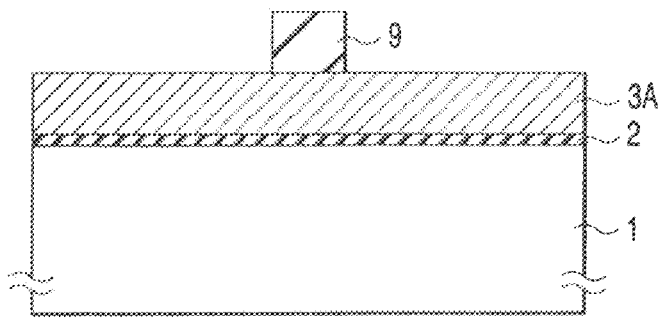
FIG. 8 is a cross-sectional view taken in the channel length direction and illustrating a step of the manufacturing process according to the first manufacturing method of the present invention.

Next, a resist is applied onto the polycrystalline silicon film 3A, and subjected to patterning to obtain a floating gate electrode having a desired channel length. Thereby, a mask pattern by the resist 9 shown in FIG. 8 is formed on the polycrystalline silicon film 3A.

Figure 9:
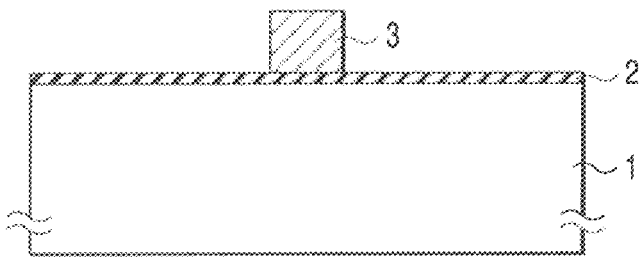
FIG. 9 is a cross-sectional view taken in the channel length direction and illustrating a step of the manufacturing process according to the first manufacturing method of the present invention.

Next, with the resist 9 used as a mask, the polycrystalline silicon film 3A is etched by using, for example, RIE (Reactive Ion Etching). Then, the resist 9 is removed and thereby, as shown in FIG. 9, first, a floating gate electrode 3 is formed on the gate insulating film 2.

Figure 10:
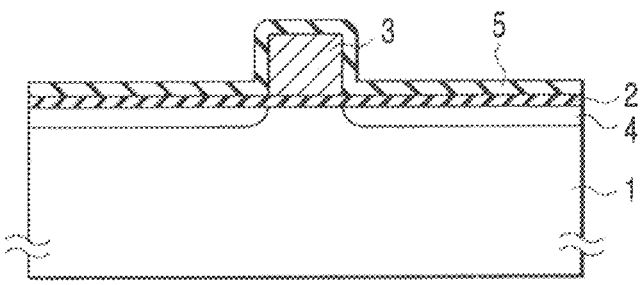
FIG. 10 is a cross-sectional view taken in the channel length direction and illustrating a step of the manufacturing process according to the first manufacturing method of the present invention.

Thereafter, as shown in FIG. 10, shallow diffusion layer regions (LDD regions) 4 are formed in the surface of the semiconductor substrate 1 in a self-alignment manner by, for example, ion implantation. Thereafter, as an interelectrode insulating film 5, an ONO film composed of three layers of a silicon oxide film/a silicon nitride film/a silicon oxide film is formed by, for example, CVD to cover the upper portion of the floating gate electrode 3 and the whole side portions, which are located in the channel length direction, of the floating gate electrode 3. In the embodiment, although an ONO film composed of three layers of a silicon oxide film/a silicon nitride film/a silicon oxide film is used as the interelectrode insulating film 5, a single-layer film composed of an insulating film of an oxide or nitride, or a high-dielectric film such as an HfSiON film may be used.

Figure 11:
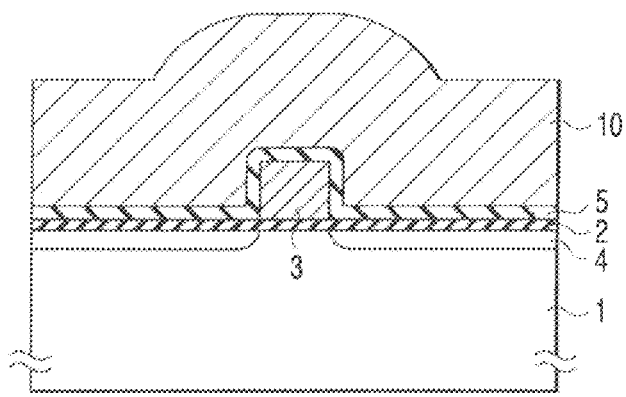
FIG. 11 is a cross-sectional view taken in the channel length direction and illustrating a step of the manufacturing process according to the first manufacturing method of the present invention.
Figure 12:
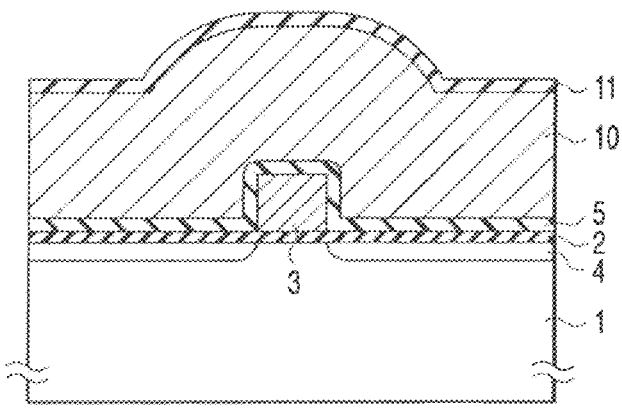
FIG. 12 is a cross-sectional view taken in the channel length direction and illustrating a step of the manufacturing process according to the first manufacturing method of the present invention.

Next, as shown in FIG. 11, a polycrystalline silicon layer 10 serving as a underlayer is formed with a film thickness of about 100 nm by, for example, CVD. Thereafter, for example, thermal oxidation is performed, and thereby a silicon oxide film 11 serving as a first mask layer is formed on the polycrystalline silicon layer 10 as shown in FIG. 12. In this step, the polycrystalline silicon layer 10 and the silicon oxide film 11 formed above the gate electrode region bulge to have a convex shape, in accordance with the thickness of the floating gate electrode 3.

Figure 13:
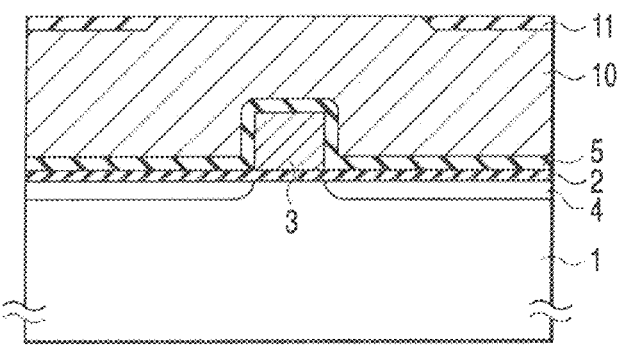
FIG. 13 is a cross-sectional view taken in the channel length direction and illustrating a step of the manufacturing process according to the first manufacturing method of the present invention.

Thereafter, the silicon oxide film 11 and the polycrystalline silicon layer 10 are flattened by, for example, CMP (Chemical Mechanical Polishing) to remove the bulging portion. Thereby, as shown in FIG. 13, part of the surface of the polycrystalline silicon layer 10 is exposed, and the silicon oxide film 11 remains on both sides of the exposed part of the polycrystalline silicon layer 10. Therefore, an opening portion for selectively etching the polycrystalline silicon layer 10 with the silicon oxide film 11 used as a mask is formed on the surface in a self-alignment manner. The size of the opening portion can be adjusted in accordance with the film thickness of the silicon oxide film 11.

Figure 14:
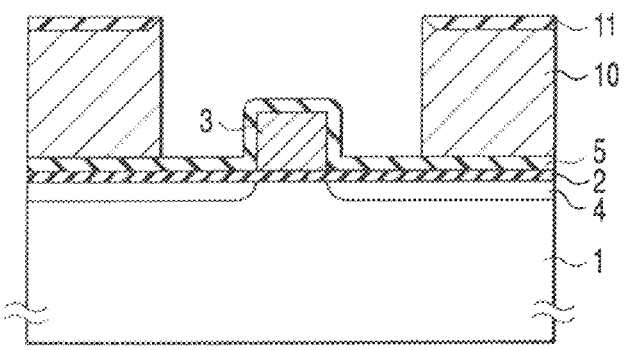
FIG. 14 is a cross-sectional view taken in the channel length direction and illustrating a step of the manufacturing process according to the first manufacturing method of the present invention.

Next, when the polycrystalline silicon layer 10 is etched by RIE or the like with the silicon oxide film 11 used as a mask, an opening is formed in the polycrystalline silicon layer 10 as shown in FIG. 14.

Figure 15:
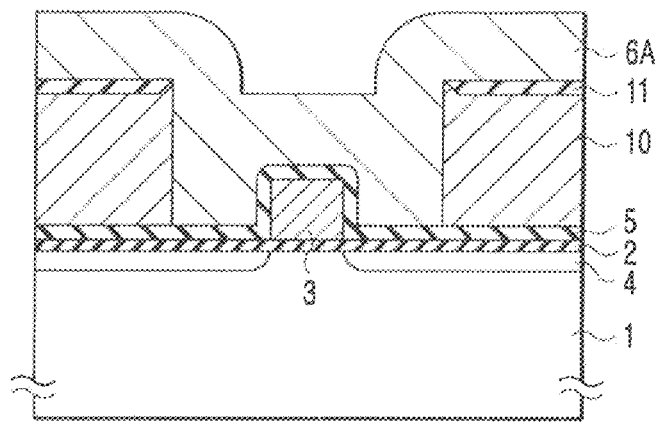
FIG. 15 is a cross-sectional view taken in the channel length direction and illustrating a step of the manufacturing process according to the first manufacturing method of the present invention.
Figure 16:
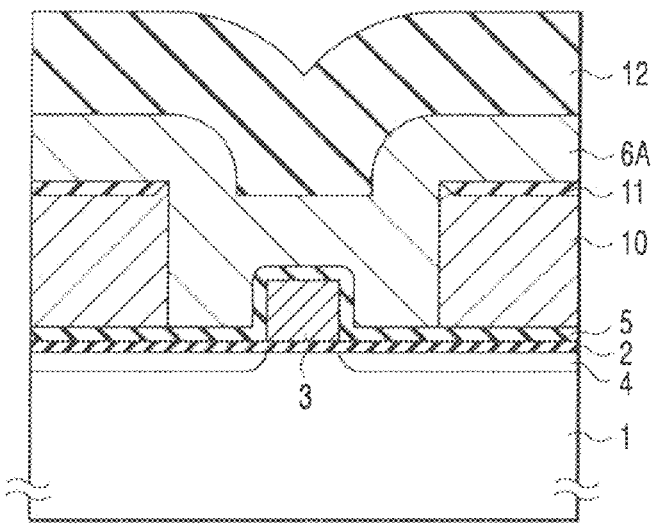
FIG. 16 is a cross-sectional view taken in the channel length direction and illustrating a step of the manufacturing process according to the first manufacturing method of the present invention.

Then, as shown in FIG. 15, a polycrystalline silicon film 6A serving as a control gate electrode is formed on the whole surface of the semiconductor substrate 1 by CVD or the like to cover the upper portion of the floating gate electrode 3 and side portions located in the channel length direction of the floating gate electrode 3. The polycrystalline silicon film 6A is formed to have a depressed portion above the floating gate electrode 3. Further, as shown in FIG. 16, a silicon nitride film 12 serving as a second mask layer is formed on the polycrystalline silicon film 6A by CVD or the like.

Figure 17:
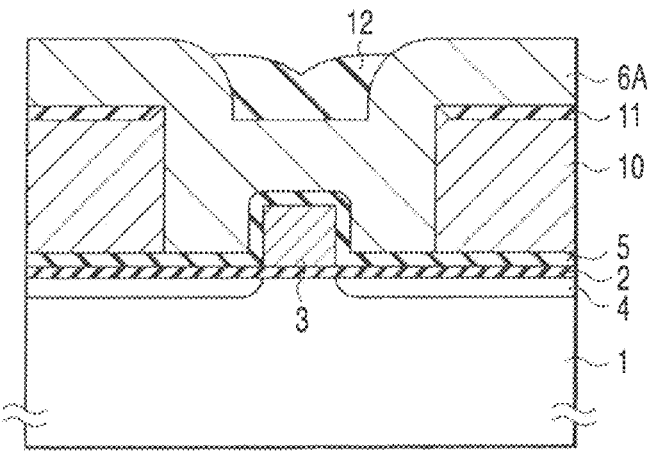
FIG. 17 is a cross-sectional view taken in the channel length direction and illustrating a step of the manufacturing process according to the first manufacturing method of the present invention.

Thereafter, the silicon nitride film 12 is etched, and thereby a mask formed of the etched silicon nitride film 12 is formed in a self-alignment manner in the depressed portion of the polycrystalline silicon film 6A above the floating gate electrode 3, as shown in FIG. 17.

Figure 18:
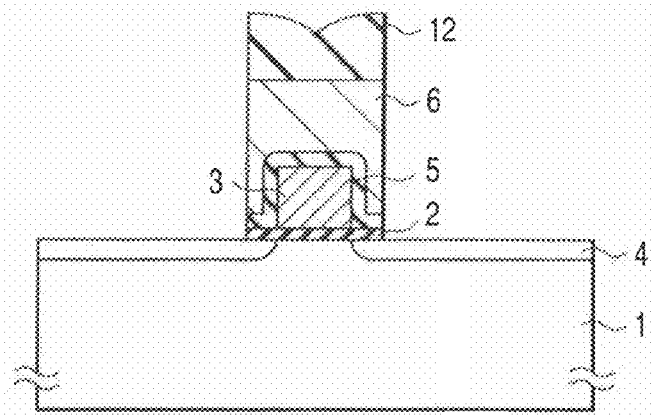
FIG. 18 is a cross-sectional view taken in the channel length direction and illustrating a step of the manufacturing process according to the first manufacturing method of the present invention.

Then, with the silicon nitride film 12 used as a mask, the polycrystalline silicon film 6A, the silicon oxide film 11, the polycrystalline silicon layer 10, the interelectrode insulating film 5, and the gate insulating film 2 are sequentially etched by RIE or the like, and thereby a control gate electrode 6 is formed in a self-alignment manner as shown in FIG. 18.

Figure 19:
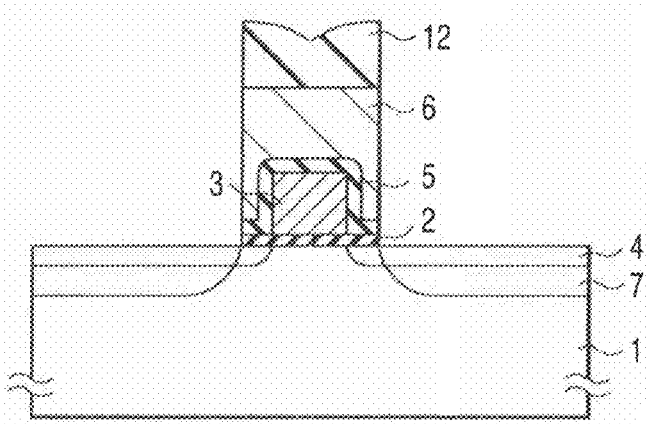
FIG. 19 is a cross-sectional view taken in the channel length direction and illustrating a step of the manufacturing process according to the first manufacturing method of the present invention.
Figure 20:
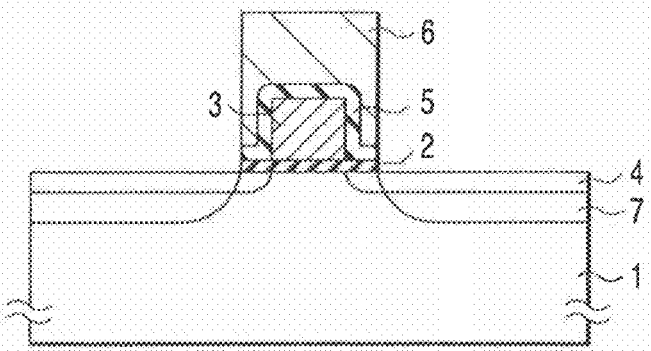
FIG. 20 is a cross-sectional view taken in the channel length direction and illustrating a step of the manufacturing process according to the first manufacturing method of the present invention.

Next, as shown in FIG. 19, deep diffusion layer regions (source/drain regions) 7 are formed in a self-alignment manner by ion implantation or the like. Thereafter, the silicon nitride film 12 is removed, and thereby a memory cell transistor according to the embodiment of the present invention is finished as shown in FIG. 20.

The memory cell transistor manufactured by the above process secures the overlap area of the control gate electrode 6 with the upper portion and side portions located in the channel length direction of the floating gate electrode 3, and thus increases the coupling capacity between the floating gate electrode 3 and the control gate electrode 6. Accordingly, the coupling ratio is improved.

Therefore, the memory cell transistor prepared in the embodiment of the present invention shortens the write/erase time.

Further, according to the manufacturing process of the embodiment, the memory cell transistor having the above structure and property is easily manufactured by a self-alignment manner, and thus the manufacturing yield is improved and the manufacturing cost is reduced.

(ii) Second Manufacturing Method

A second manufacturing method of the memory cell transistor shown in FIG. 1 is explained with reference to FIGS. 21 to 33. FIGS. 21 to 33 are diagrams illustrating a manufacturing process of the memory cell transistor in the embodiment, showing a cross section in the channel length direction thereof.

Figure 21:
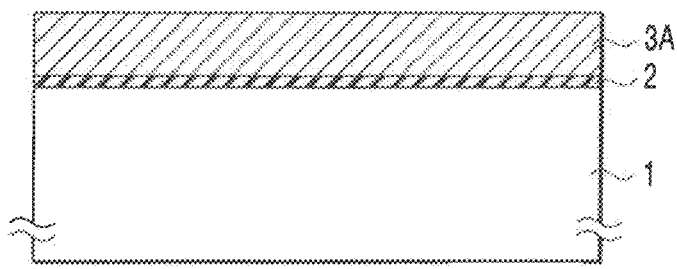
FIG. 21 is a cross-sectional view taken in a channel length direction and illustrating a step of a manufacturing process according to a second manufacturing method of the present invention.

First, as shown in FIG. 21, a gate insulating film (tunnel insulating film) 2 is formed on a semiconductor substrate 1 by, for example, thermal oxidation. Thereafter, a polycrystalline silicon film 3A serving as a floating gate electrode is formed on the gate insulating film 2 by, for example, CVD.

Figure 22:
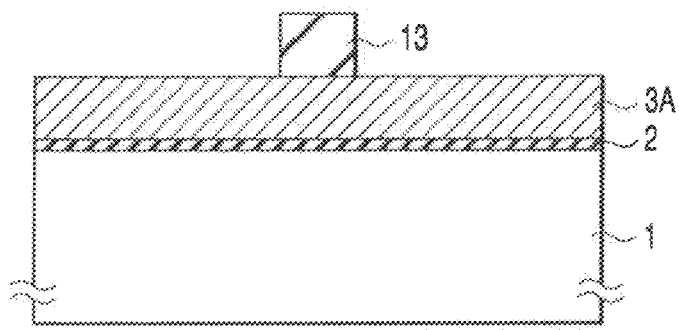
FIG. 22 is a cross-sectional view taken in the channel length direction and illustrating a step of the manufacturing process according to the second manufacturing method of the present invention.

Next, a resist is applied onto the polycrystalline silicon film 3A, and subjected to patterning to obtain a floating gate electrode having a desired channel length. Thereby, a mask pattern composed of the resist 13 shown in FIG. 22 is formed on the polycrystalline silicon film 3A.

Figure 23:
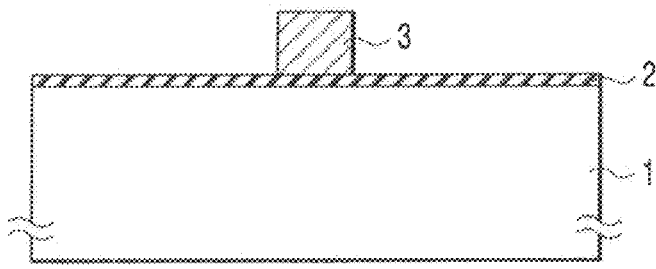
FIG. 23 is a cross-sectional view taken in the channel length direction and illustrating a step of the manufacturing process according to the second manufacturing method of the present invention.

Next, with the resist 13 used as a mask, the polycrystalline silicon film 3A is etched by using, for example, RIE, and the resist 13 is removed. Thereby, as shown in FIG. 23, first, a floating gate electrode 3 is formed.

Figure 24:
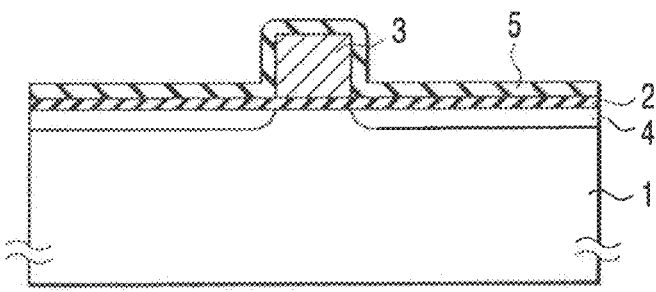
FIG. 24 is a cross-sectional view taken in the channel length direction and illustrating a step of the manufacturing process according to the second manufacturing method of the present invention.

Thereafter, as shown in FIG. 24, shallow diffusion layer regions (LDD regions) 4 are formed in the surface of the semiconductor substrate 1 in a self-alignment manner by, for example, ion implantation. Thereafter, as an interelectrode insulating film 5, an ONO film is formed by, for example, CVD to cover the upper portion of the floating gate electrode 3 and the whole side portions located in the channel length direction of the floating gate electrode 3.

Figure 25:
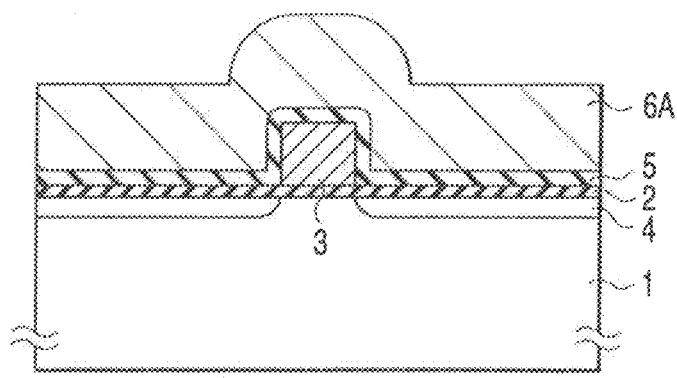
FIG. 25 is a cross-sectional view taken in the channel length direction and illustrating a step of the manufacturing process according to the second manufacturing method of the present invention.

Next, as shown in FIG. 25, a polycrystalline silicon film 6A serving as a control gate electrode is formed on the whole surface of the semiconductor substrate 1 by CVD or the like to cover the upper portion of the interelectrode insulating film 5 and whole side portions located in the channel length direction of the interelectrode insulating film 5.

Figure 26:
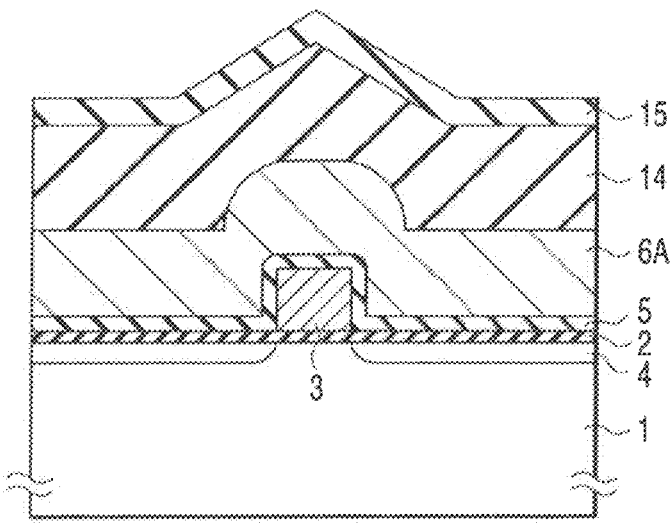
FIG. 26 is a cross-sectional view taken in the channel length direction and illustrating a step of the manufacturing process according to the second manufacturing method of the present invention.

Thereafter, as shown in FIG. 26, a silicon oxide layer 14 serving as an underlayer is formed on the polycrystalline silicon film 6A by, for example, CVD. Further, a silicon nitride film 15 serving as a first mask layer is formed on the silicon oxide layer 14 by CVD or the like. In this step, the polycrystalline silicon film 6A, the silicon oxide layer 14 and the silicon nitride film 15 formed above the floating gate electrode 3 bulge to have a convex shape, in accordance with the thickness of the floating gate electrode 3.

Figure 27:
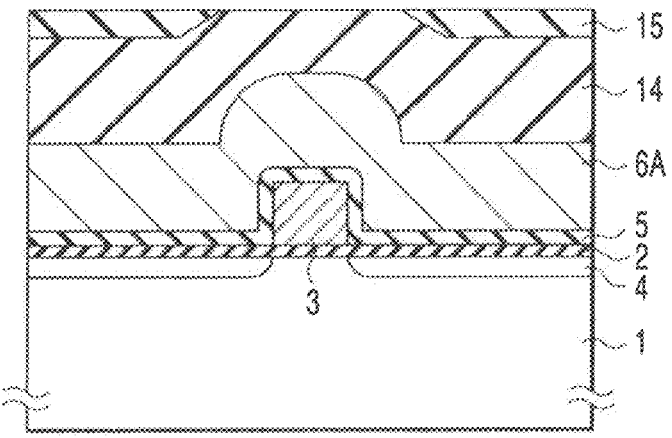
FIG. 27 is a cross-sectional view taken in the channel length direction and illustrating a step of the manufacturing process according to the second manufacturing method of the present invention.

Thereafter, the silicon nitride film 15 and the silicon oxide layer 14 are flattened by, for example, CMP to remove the bulging portion. Thereby, as shown in FIG. 27, part of the surface of the silicon oxide layer 14 is exposed, and the silicon nitride film 15 remains on both sides of the exposed part of the silicon oxide layer 14. Therefore, an opening portion for selectively etching the silicon oxide layer 14 with the silicon nitride film 15 used as a mask is formed on the surface of the silicon oxide film 14 in a self-alignment manner. The size of the opening portion can be adjusted in accordance with the film thickness of the silicon nitride film 15.

Figure 28:
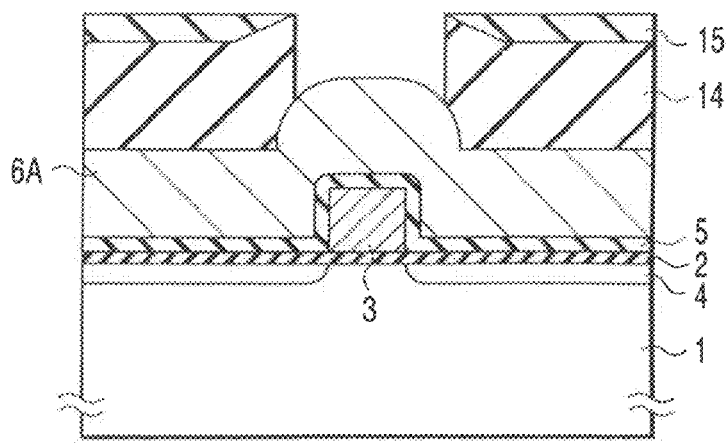
FIG. 28 is a cross-sectional view taken in the channel length direction and illustrating a step of the manufacturing process according to the second manufacturing method of the present invention.

Next, the silicon oxide layer 14 is etched by RIE or the like with the silicon nitride film 15 used as a mask, and thereby an opening is formed in the silicon oxide layer 14 as shown in FIG. 28.

Figure 29:
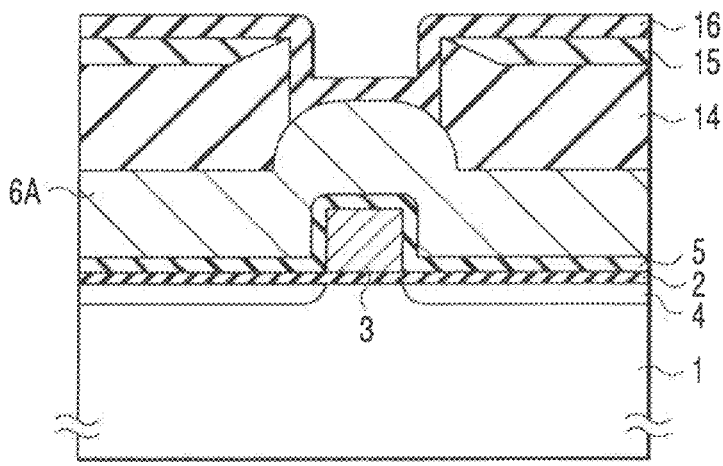
FIG. 29 is a cross-sectional view taken in the channel length direction and illustrating a step of the manufacturing process according to the second manufacturing method of the present invention.

Further, as shown in FIG. 29, a silicon nitride film 16 serving as a second mask layer is formed on the exposed polycrystalline silicon film 6A in the opening portion of the silicon oxide layer 14 and on the silicon nitride film 15 by CVD or the like.

Figure 30:
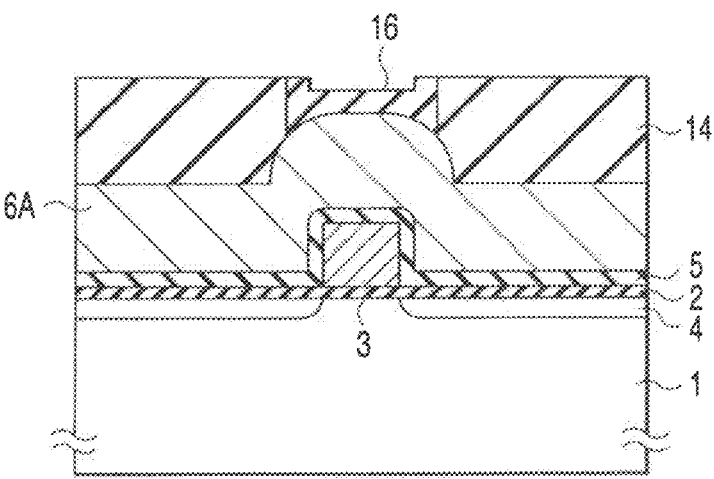
FIG. 30 is a cross-sectional view taken in the channel length direction and illustrating a step of the manufacturing process according to the second manufacturing method of the present invention.

Thereafter, the silicon nitride films 15 and 16 are removed by CMP, and thereby a mask formed of the silicon nitride film 16 remains in a self-alignment manner in the opening portion of the silicon oxide layer 14 above the floating gate electrode 3, as shown in FIG. 30.

Figure 31:
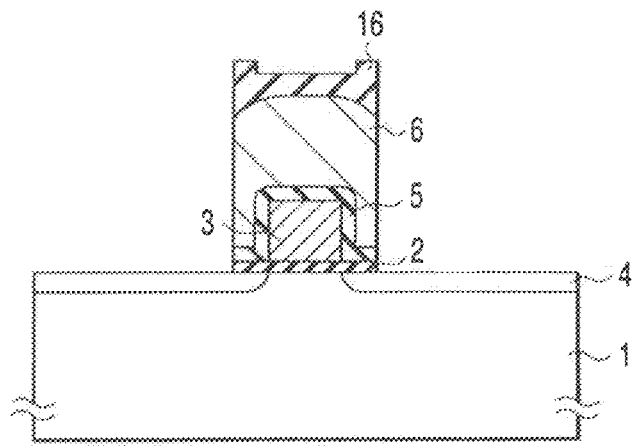
FIG. 31 is a cross-sectional view taken in the channel length direction and illustrating a step of the manufacturing process according to the second manufacturing method of the present invention.

Then, with the silicon nitride film 16 used as a mask, the silicon oxide film 14, the polycrystalline silicon film 6A, the interelectrode insulating film 5, and the gate insulating film 2 are sequentially etched by RIE or the like, and thereby a control gate electrode 6 is formed in a self-alignment manner as shown in FIG. 31.

Figure 32:
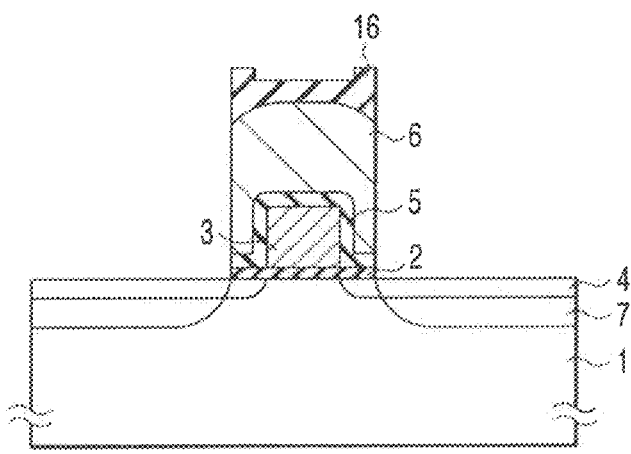
FIG. 32 is a cross-sectional view taken in the channel length direction and illustrating a step of the manufacturing process according to the second manufacturing method of the present invention.
Figure 33:
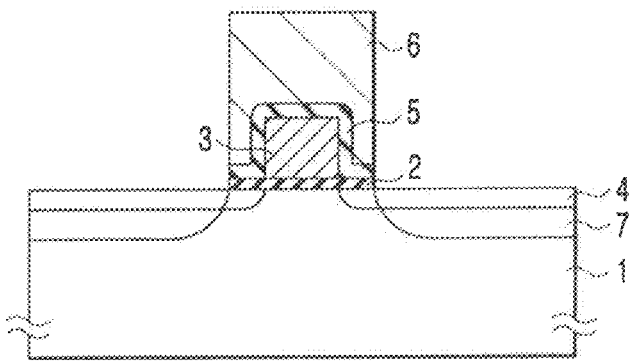
FIG. 33 is a cross-sectional view taken in the channel length direction and illustrating a step of the manufacturing process according to the second manufacturing method of the present invention.

Next, as shown in FIG. 32, deep diffusion layer regions (source/drain regions) 7 are formed in a self-alignment manner by ion implantation or the like. Thereafter, the silicon nitride film 16 is removed, and thereby a memory cell transistor according to the embodiment of the present invention is finished as shown in FIG. 33.

The memory cell transistor manufactured by the above process secures the overlap area of the control gate electrode 6 with the upper portion and side portions, located in the channel length direction, of the floating gate electrode 3, and thus increases the coupling capacity between the floating gate electrode 3 and the control gate electrode 6. Accordingly, the coupling ratio is improved.

Therefore, the memory cell transistor prepared in the embodiment of the present invention shortens the write/erase time.

Further, according to the manufacturing process of the embodiment, the memory cell transistor having the above structure and property is easily manufactured by a self-alignment manner, and thus the manufacturing yield is improved and the manufacturing cost is reduced.

3. Applied Examples (1) NAND Flash Memory

Explained is the case where a memory cell transistor according to the embodiment of the present invention is applied to a NAND flash memory.

(i) Structure

FIG. 34 is a diagram illustrating an equivalent circuit of a memory cell unit of a NAND flash memory.

In the memory cell unit, 8 memory cell transistors MT1 to MT8 according to the embodiment of the present invention are connected in series, and select transistors ST1 and ST2 are connected to respective ends of the unit.

A bit line BL is connected to a source/drain region of the select transistor ST1, and a source line SL is connected to a source/drain region of the select transistor ST2.

In the embodiment, explained is a memory cell unit using 8 memory cell transistors. However, the present invention is not limited by the number of memory cell transistors connected in series.

Figure 35A:
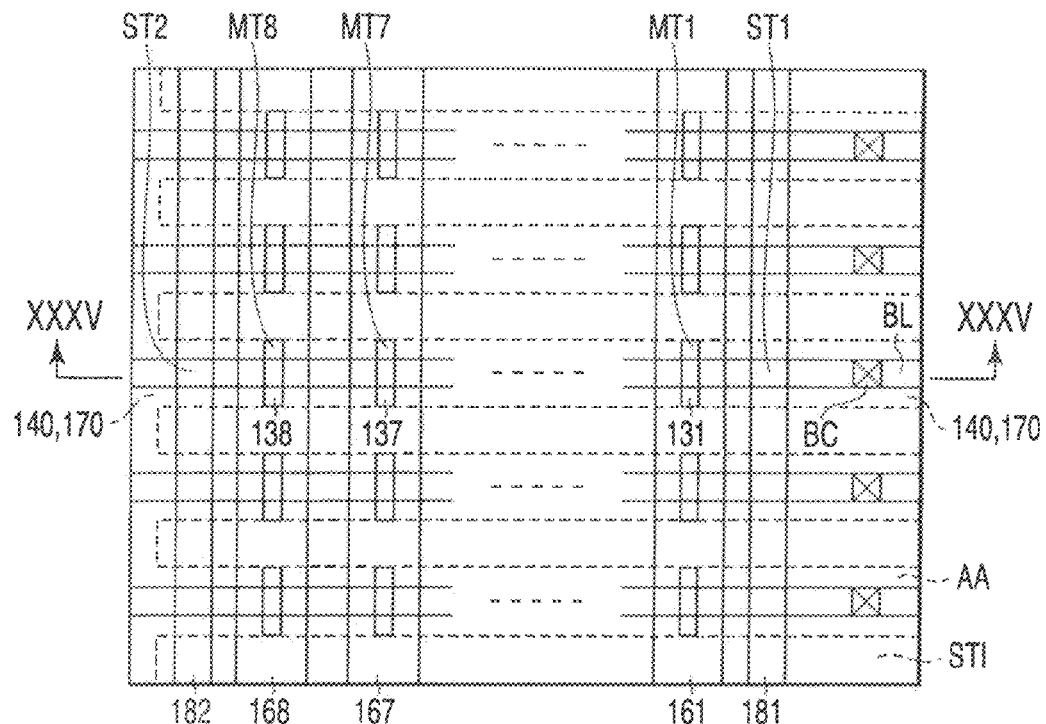
FIG. 35A is a plan view of a device structure of the NAND flash memory being the first applied example.
Figure 35B:
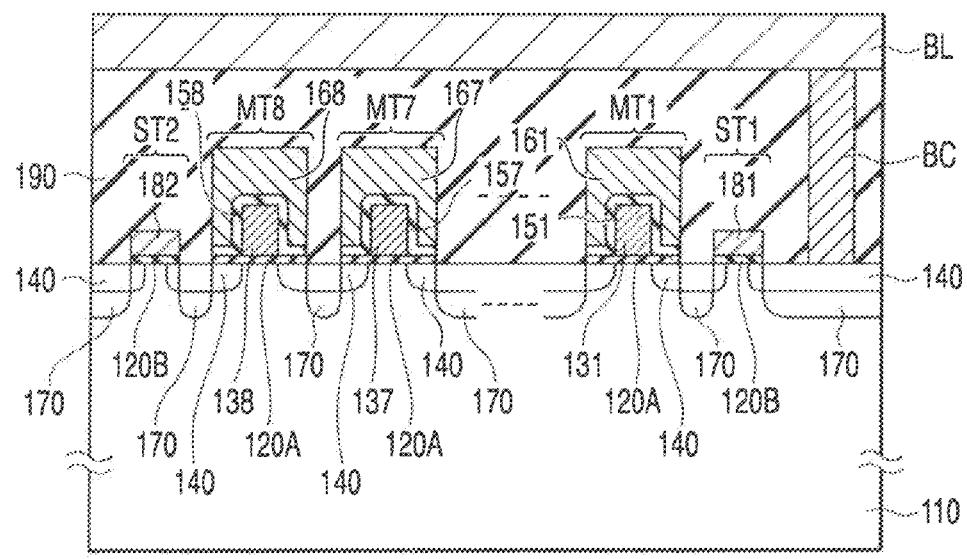
FIG. 35B is a cross-sectional view of the device structure of the NAND flash memory being the first applied example.

FIG. 35A is a plan view of a device structure of the NAND flash memory, and FIG. 35B is a cross-sectional view taken along line XXXV-XXXV of FIG. 35A.

A surface region of a semiconductor substrate 110 is formed of, for example, device isolation insulating layers STI having an STI (Shallow Trench Isolation) structure, and active regions (device region) AA surrounded thereby.

The memory cell transistors MT1 to MT8 are formed in the active regions (device regions) AA on the semiconductor substrate 110. The transistors have gate structures in which upper portions and side portions, which are located in the channel length direction, of floating gate electrodes 131 to 138 formed on the gate insulating film 120A are covered with control gate electrodes 161 to 168, respectively, with interelectrode insulating films 151 to 158 interposed therebetween.

The select transistors ST1 and ST2 are formed on the respective ends of the unit of the memory cell transistors MT1 to MT8. Gate structures of the select transistors ST1 and ST2 are formed of gate electrodes 181 and 182 on a gate insulating film 120B, respectively.

Adjacent two transistors in the above transistors have a shallow diffusion layer region (LDD region) 140 and a deep diffusion layer region (source/drain region) 170 in common. Further, an interlayer insulating film 190 is formed to cover the whole surface of the semiconductor substrate 110, and embedded in spaces between the adjacent transistors.

The bit line BL is formed on the interlayer insulating film 190, and connected to the diffusion layer region of the select transistor ST1 via a bit line contact portion BC.

(ii) Manufacturing Method

A method of manufacturing the NAND flash memory in the applied example, with reference to FIG. 36A, FIG. 36B to FIG. 42A and FIG. 42B.

Figure 36A:
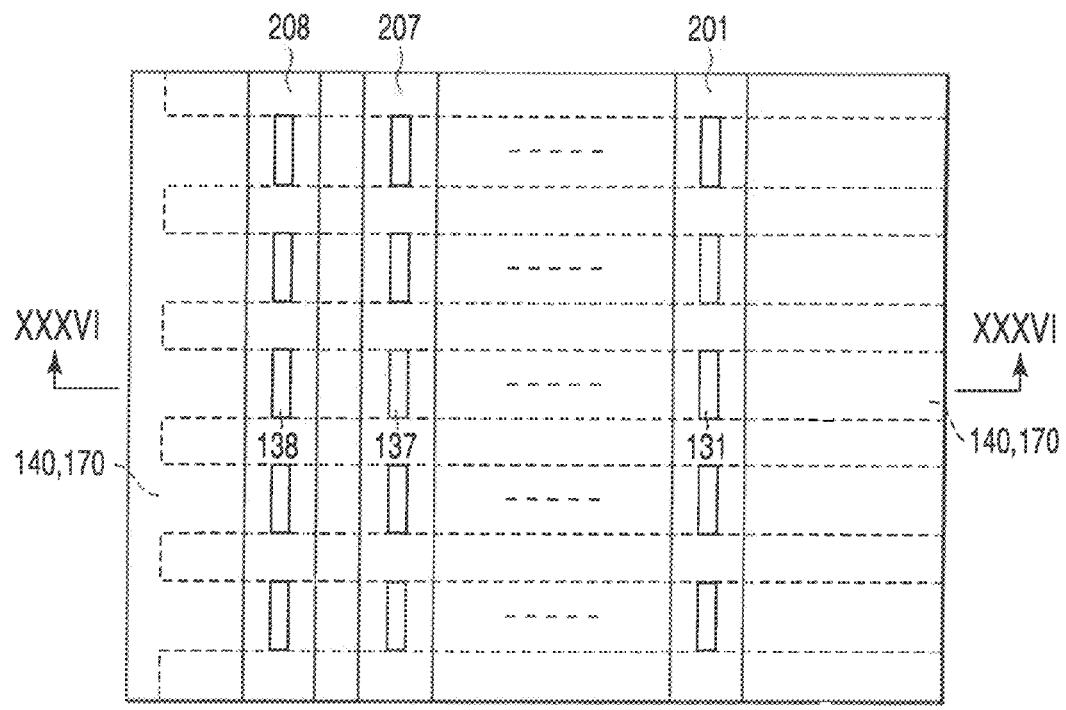
FIG. 36A is a plan view of a step of a manufacturing process according to the first applied example.
Figure 36B:
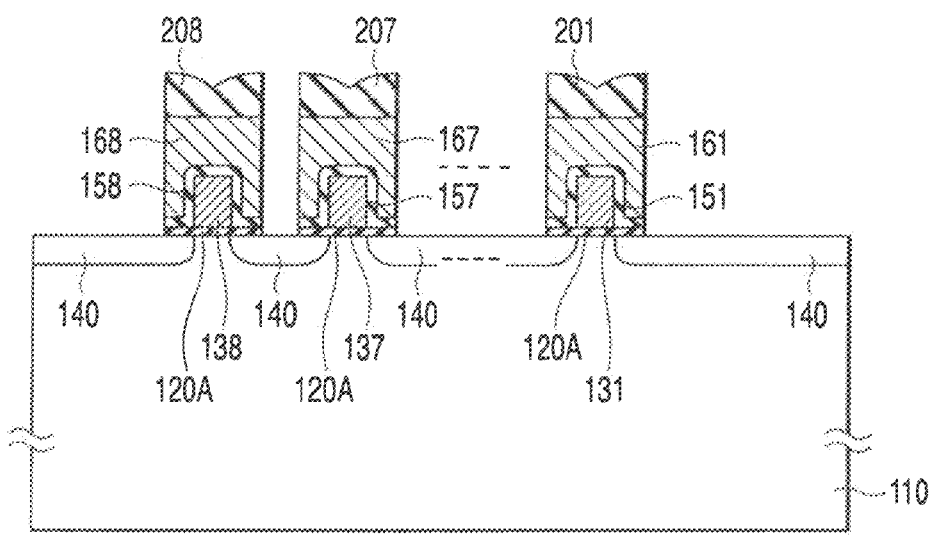
FIG. 36B is a cross-sectional view of the step shown in FIG. 36A of the manufacturing process according to the first applied example.

First, as shown in FIGS. 36A and 36B, 8 memory cell transistors are formed in active regions (device regions) AA on the semiconductor substrate 110, by using the first or second manufacturing method in the embodiment of the present invention. In the first and second embodiments, the silicon nitride films 201 to 208 formed on the control gate electrode 161 to 168 in this applied example are removed and deep diffusion layers (source/drain regions) are formed directly after the formation. However, in this applied example, these steps are not performed yet.

Figure 37A:
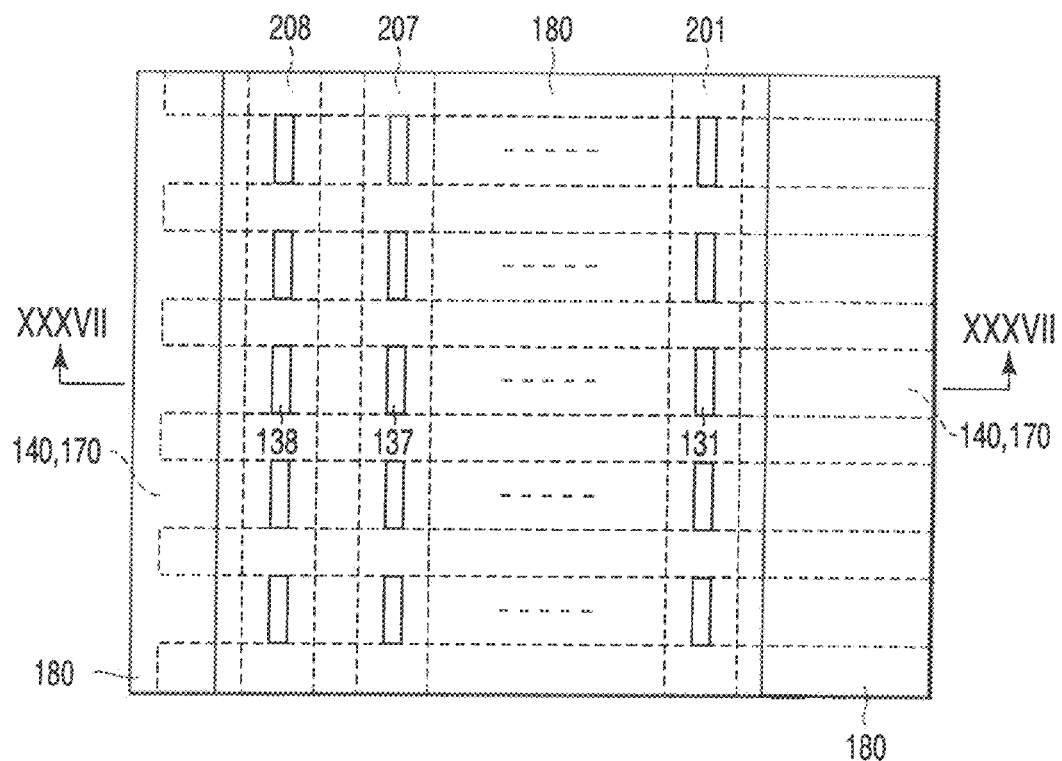
FIG. 37A is a plan view of a step of the manufacturing process according to the first applied example.
Figure 37B:
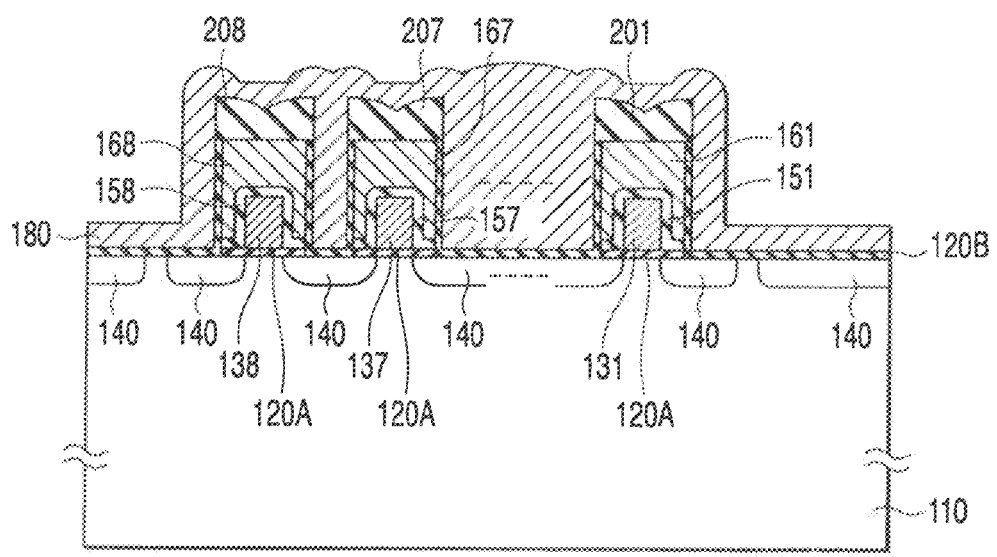
FIG. 37B is a cross-sectional view of the step shown in FIG. 37A of the manufacturing process according to the first applied example.

Next, as shown in FIGS. 37A and 37B, channel implantation is performed in regions in which select transistors are to be formed, and thereafter a gate insulating film 120B is formed by thermal oxidation or the like. Further, a polycrystalline silicon film 180 is formed by CVD or the like. In this step, spaces between the adjacent memory cell transistors are filled with the polycrystalline silicon film 180.

Figure 38A:
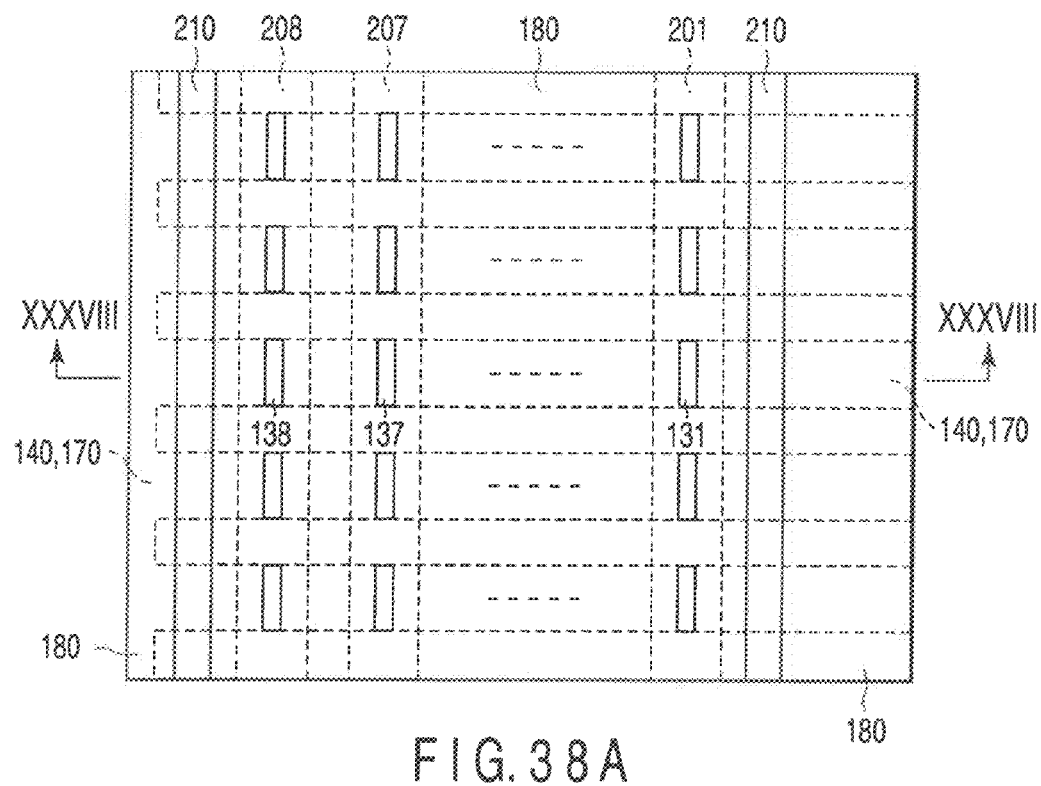
FIG. 38A is a plan view of a step of the manufacturing process according to the first applied example.
Figure 38B:
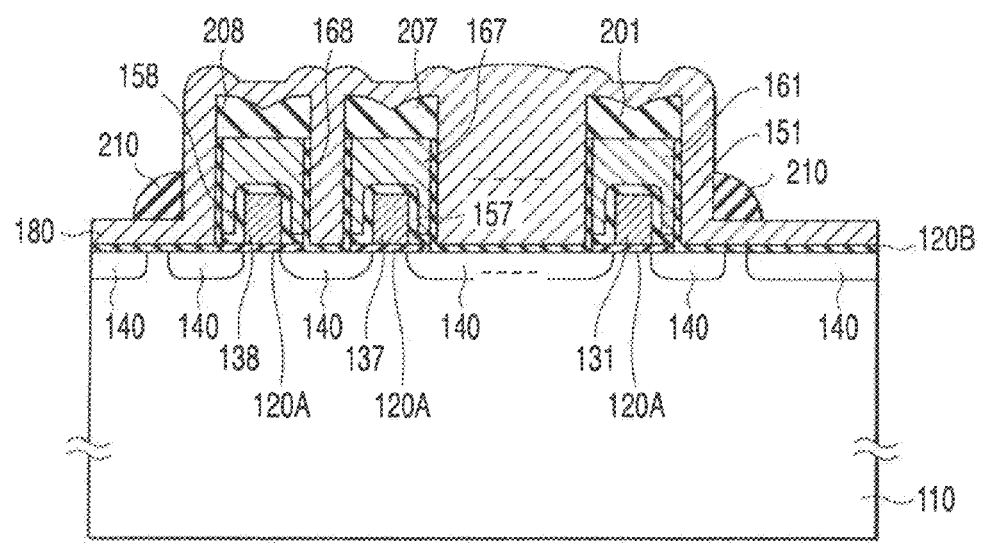
FIG. 38B is a cross-sectional view of the step shown in FIG. 38A of the manufacturing process according to the first applied example.

Next, a silicon oxide film is deposited on the whole surface of the polycrystalline silicon film 180 by CVD or the like, and then etched back. Thereby, as shown in FIGS. 38A and 38B, the silicon oxide film 210 remains on both sides of the unit of the memory cell transistors, that is, in regions in which select transistors are to be formed. The silicon oxide film 210 serves as a mask layer when gate electrodes of select transistors are formed.

Figure 39A:
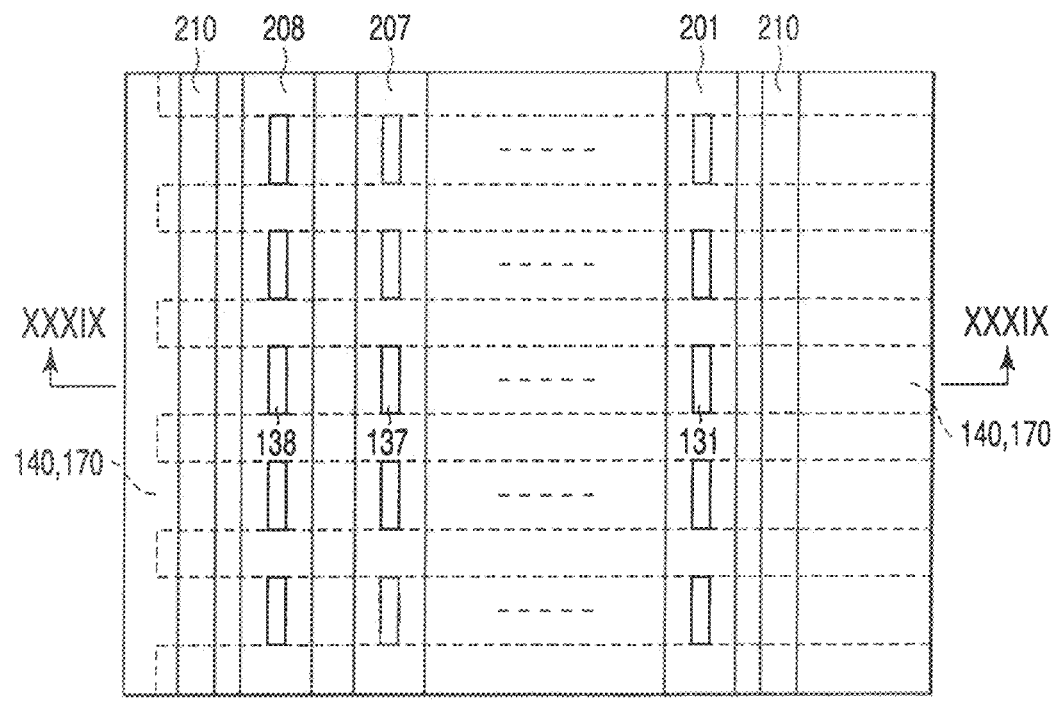
FIG. 39A is a plan view of a step of the manufacturing process according to the first applied example.
Figure 39B:
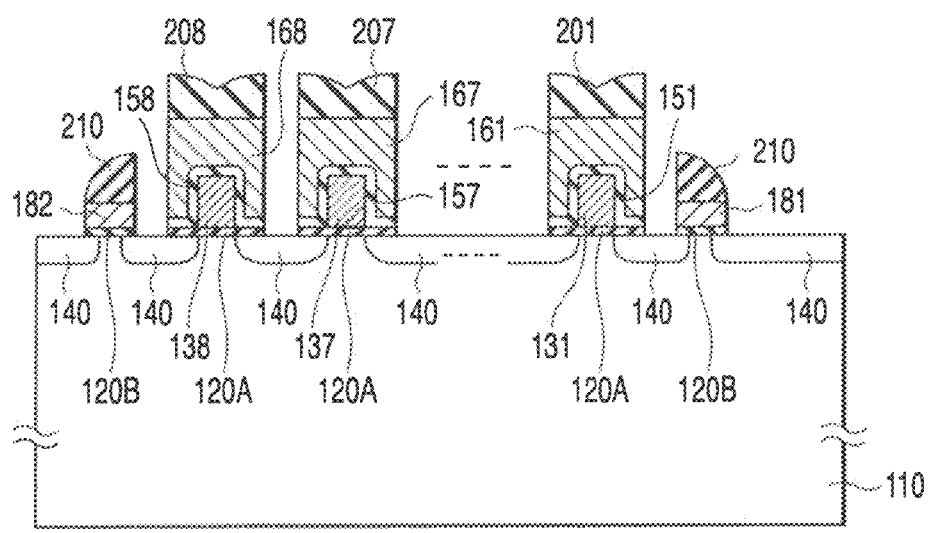
FIG. 39B is a cross-sectional view of the step shown in FIG. 39A of the manufacturing process according to the first applied example.

Thereafter, the polycrystalline silicon film 180 and the gate insulating film 120B are etched, with the silicon oxide film 210 used as a mask. Thereby, as shown in FIGS. 39A and 39B, polycrystalline silicon films 181 and 182 remains under the silicon oxide film 210 without being etched.

Figure 40A:
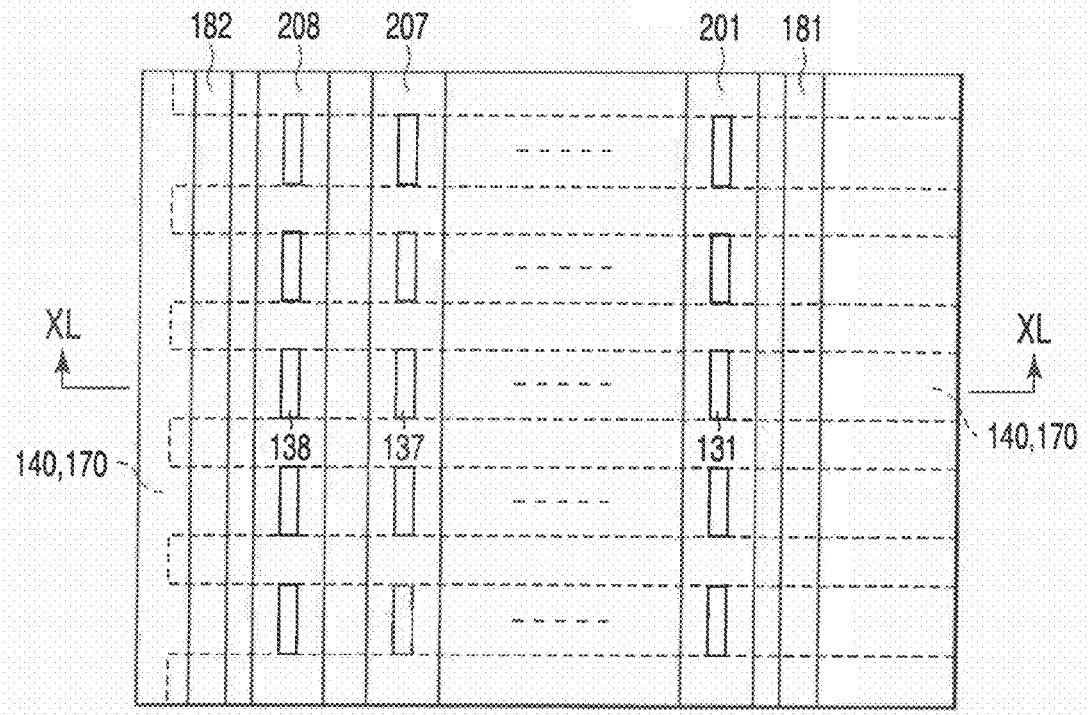
FIG. 40A is a plan view of a step of the manufacturing process according to the first applied example.
Figure 40B:
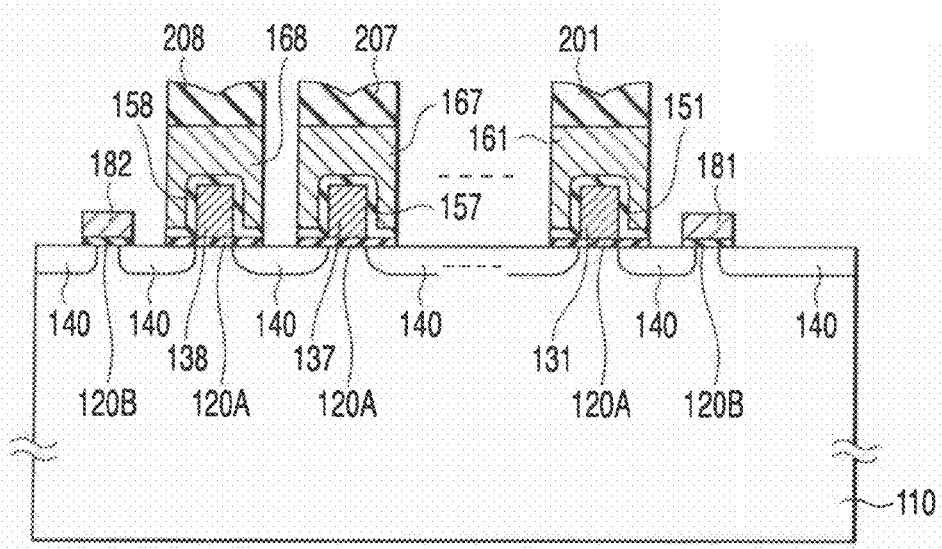
FIG. 40B is a cross-sectional view of the step shown in FIG. 40A of the manufacturing process according to the first applied example.

Next, the silicon oxide film 210 is removed, and thereby a structure shown in FIGS. 40A and 40B is obtained, in which gate electrodes of select transistors formed of the polycrystalline silicon films 181 and 182 are formed on respective ends of the unit of the memory cell transistors.

Then, ion implantation is performed with respect to the whole surface of the semiconductor substrate 110, and the silicon nitride films 201 to 208 are removed. Thereby, as shown in FIGS. 41A and 41B, deep diffusion layer regions (source/drain regions) 170 are formed in a self-alignment manner.

Figure 42A:
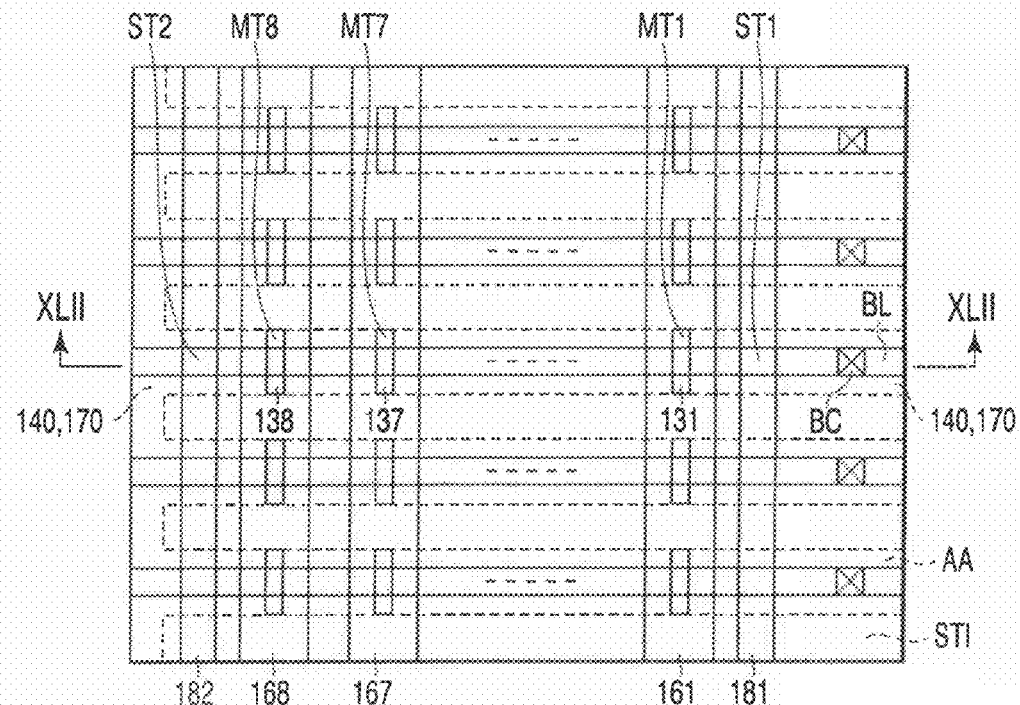
FIG. 42A is a plan view of a step of the manufacturing process according to the first applied example.
Figure 42B:
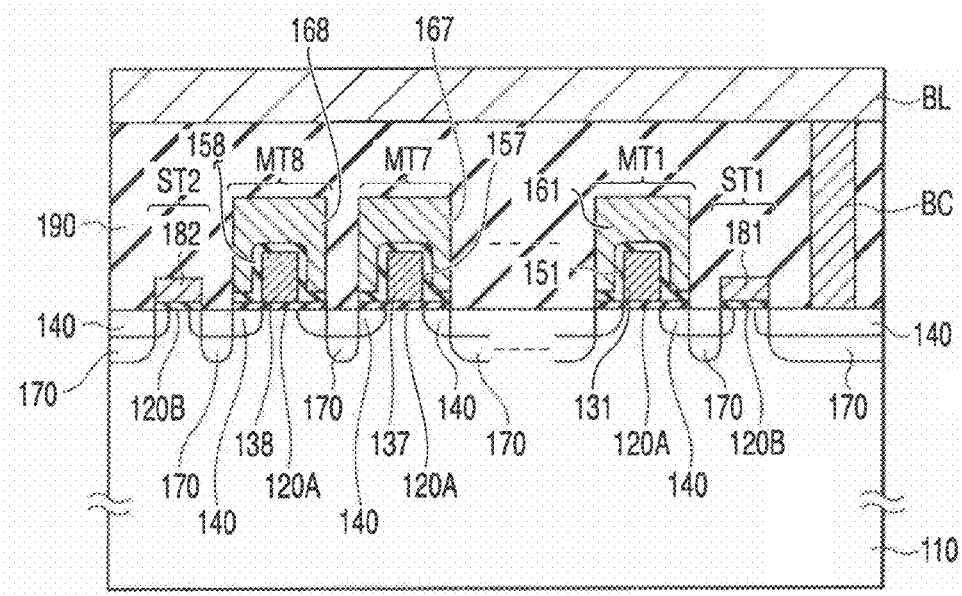
FIG. 42B is a cross-sectional view of the step shown in FIG. 42A of the manufacturing process according to the first applied example.

Next, as shown in FIGS. 42A and 42B, an interlayer insulating film 190 is formed by CVD or the like to cover the whole surfaces of the memory cell transistors MT1 to MT8 and the select transistors ST1 and ST2. Thereafter, a bit line contact portion BC is formed in the interlayer insulating film 190 to reach the diffusion layer region located outside the select transistor ST1. Further, a bit line BL is formed on the interlayer insulating film 190 to establish electrical conduction with the bit line contact portion BC. Thereby, the memory cell unit of the NAND flash memory according to the first applied example is finished.

(iii) Conclusion

As described above, the memory cell transistor according to the embodiment of the present invention is applicable to a NAND flash memory.

Further, by using the above manufacturing method, a NAND flash memory to which the memory cell transistor of the present invention is applied is manufactured by a self-alignment manner, and thereby the manufacturing yield is improved.

(2) Two-Transistor Flash Memory

Explained below is the case where the memory cell transistor according to the embodiment of the present invention is applied to a two-transistor flash memory.

(i) Structure

Figure 43:
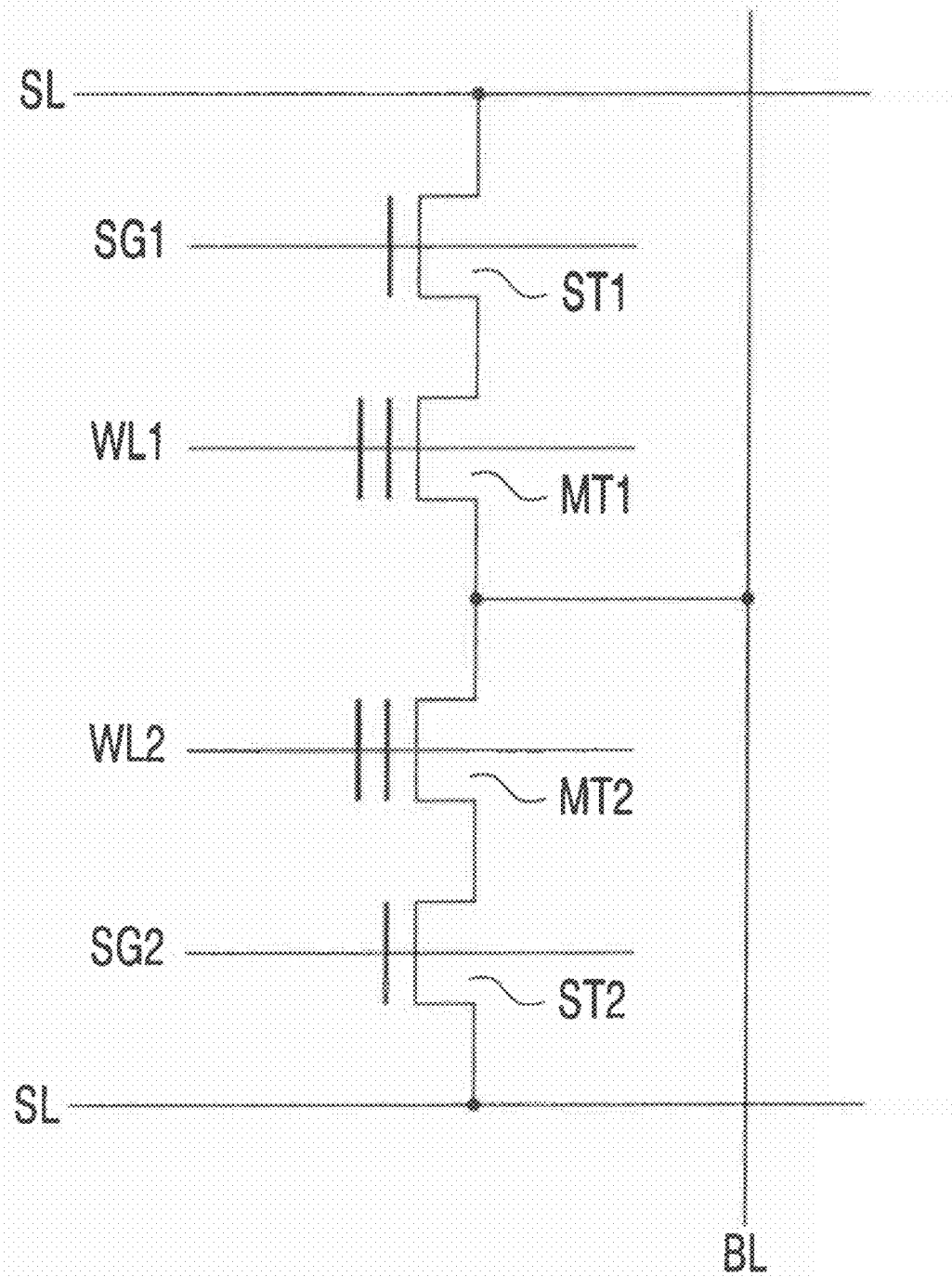
FIG. 43 is a diagram illustrating an equivalent circuit of a two-transistor flash memory being a second applied example of the present invention.

FIG. 43 is a diagram illustrating an equivalent circuit of two-transistor flash memories.

A two-transistor flash memory is formed of one memory cell transistor and one select transistor.

When two-transistor flash memories are connected in series, two two-transistor flash memories are connected to be symmetrical. Specifically, two memory cell transistors MT1 and MT2 are connected in series, and select transistors ST1 and ST2 are connected to outer ends of the memory cell transistors MT1 and MT2, respectively.

A bit line BL is connected between the memory cell transistors MT1 and MT2, and source lines SL are connected to the select transistors ST1 and ST2.

Figure 44A:
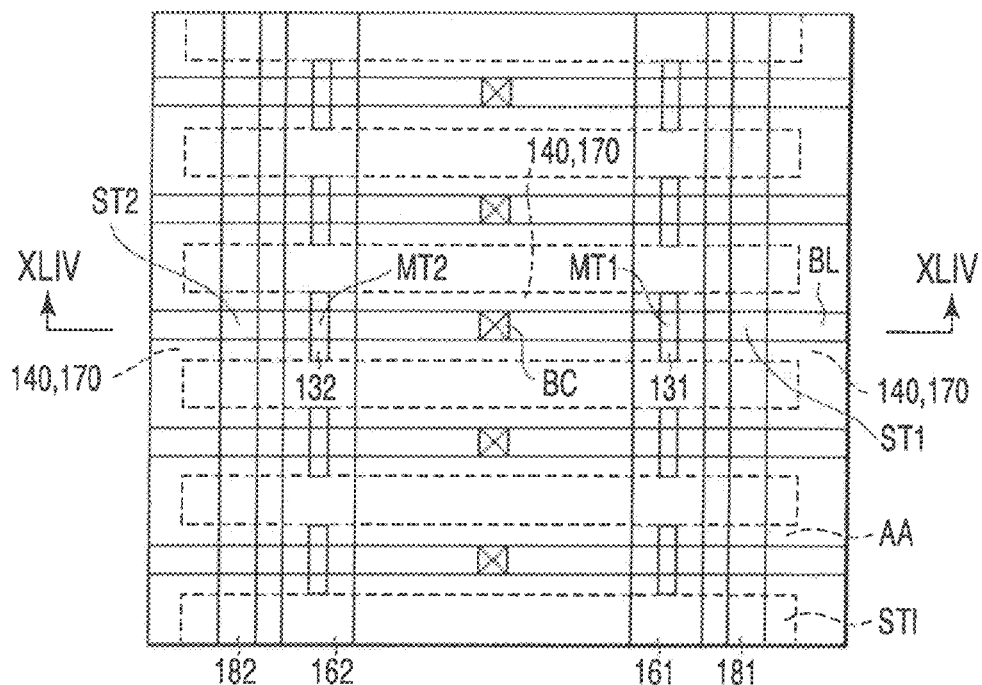
FIG. 44A is a plan view of a device structure of the two-transistor flash memory being the second applied example.
Figure 44B:
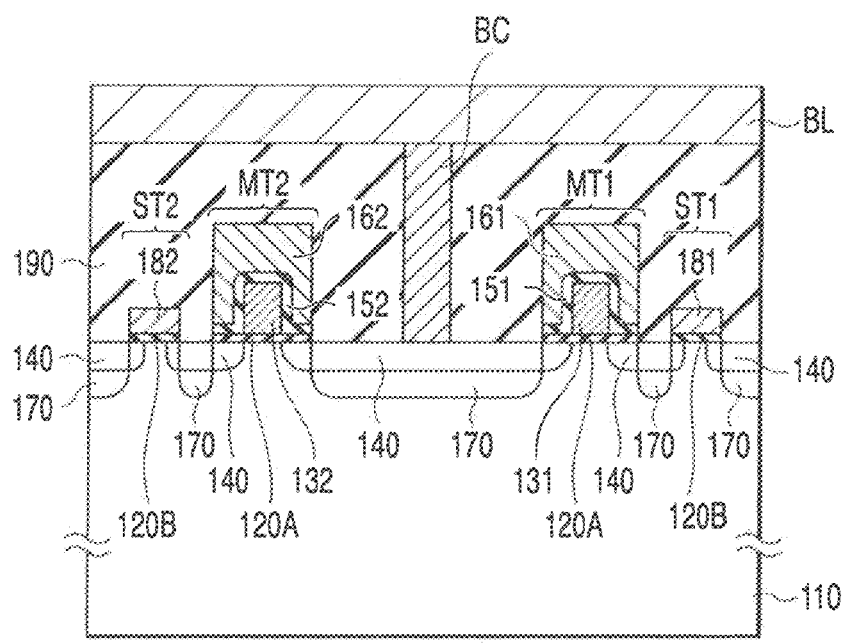
FIG. 44B is a cross-sectional view of the device structure of the two-transistor flash memory being the second applied example.

FIG. 44A is a plan view of a device structure of the two-transistor flash memory, and FIG. 44B is a cross-sectional view taken along line XLIV-XLIV of FIG. 44A.

The surface region of a semiconductor substrate 110 is formed of device isolation insulating layers STI having an STI structure, and active regions (device regions) AA surrounded by the device isolation insulating layers STI.

The memory cell transistors MT1 and MT2 are formed in the active regions (device regions) AA on the semiconductor substrate 110. The memory cell transistors MT1 and MT2 have gate structures in which upper portions and side portions located in the channel length direction of floating gate electrodes 131 and 132 formed on a gate insulating film (tunnel insulating film) 120A are covered with control gate electrodes 161 and 162, respectively, with interelectrode insulating films 151 and 152.

The select transistors ST1 and ST2 are formed outside the memory cell transistors MT1 and MT2, respectively. The gate structures of the select transistors ST1 and ST2 are formed of gate electrodes 181 and 182 on the gate insulating film 120B, respectively.

Adjacent two transistors in the transistors have a shallow diffusion layer region (LDD region) 140 and a deep diffusion layer region (source/drain region) 170 in common. Further, an interlayer insulating film 190 is formed to cover the whole surface of the semiconductor substrate 100, and embedded in spaces between the adjacent transistors.

The bit line BL is formed on the interlayer insulating film 190, and connected to the diffusion layer region shared by the memory cell transistors MT1 and MT2 through a bit line contact portion BC.

(ii) Manufacturing Method

A manufacturing method of the two-transistor flash memory in this applied example is explained below, with reference to FIG. 45A, FIGS. 45B to 53A, and FIG. 53B.

Figure 45A:
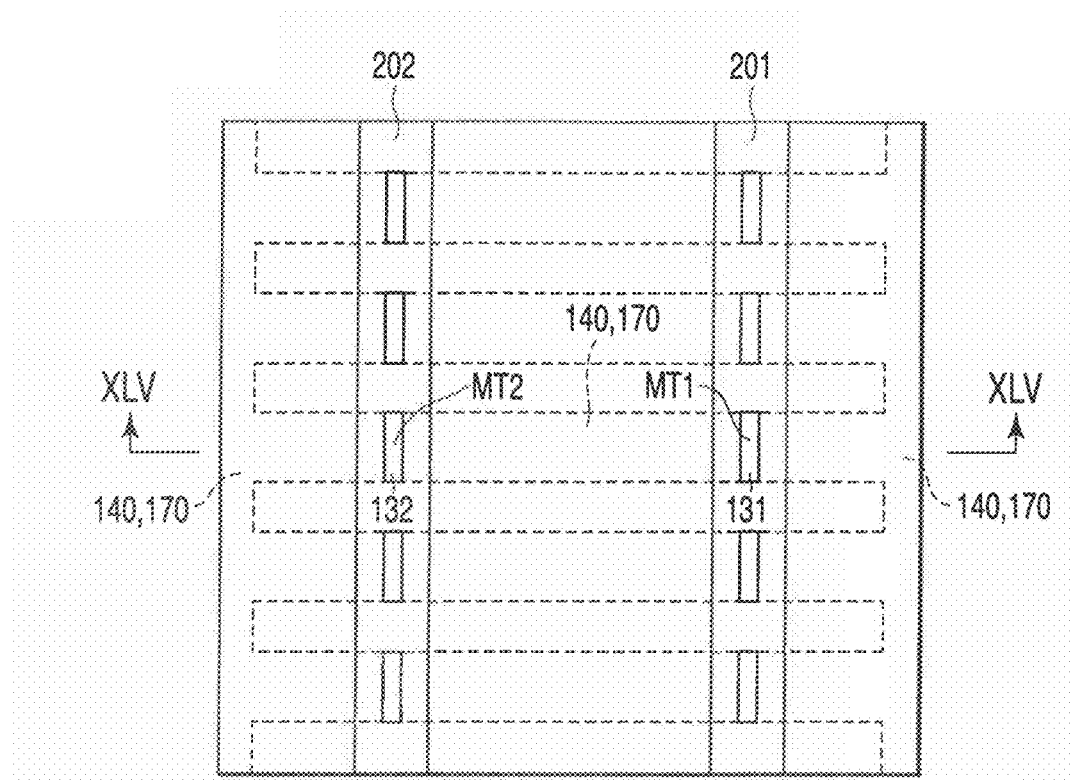
FIG. 45A is a plan view of a step of the manufacturing process according to the second applied example.
Figure 45B:
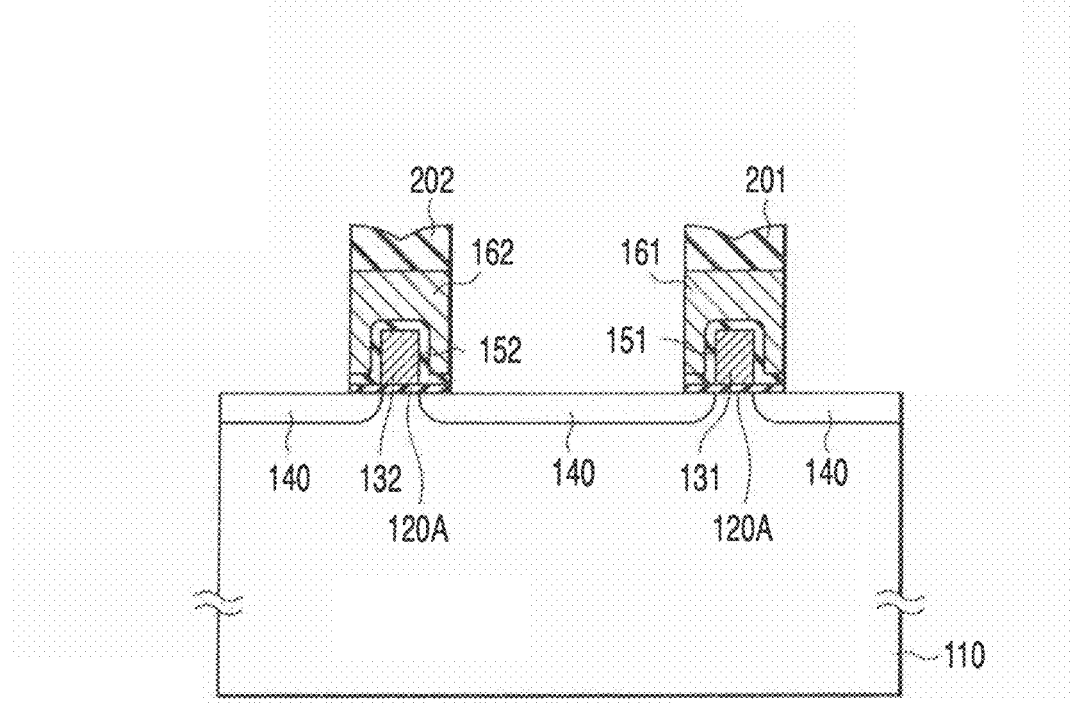
FIG. 45B is a cross-sectional view of the step shown in FIG. 45A of the manufacturing process according to the second applied example.

FIG. 45A is a plan view illustrating a step of the manufacturing method, and FIG. 45B is a cross-sectional view taken along line XLV-XLV of FIG. 45A.

First, as shown in FIGS. 45A and 45B, two memory cell transistors are formed in the active regions (device regions) AA on a semiconductor substrate 110, by using the first or second manufacturing method in the embodiment. In the first and second manufacturing methods, the silicon nitride films 201 and 202 formed on the control gate electrodes 161 and 162 in this applied example are removed and deep diffusion layers (source/drain regions) are formed directly after the formation. However, in this applied example, these steps are not performed yet.

Figure 46A:
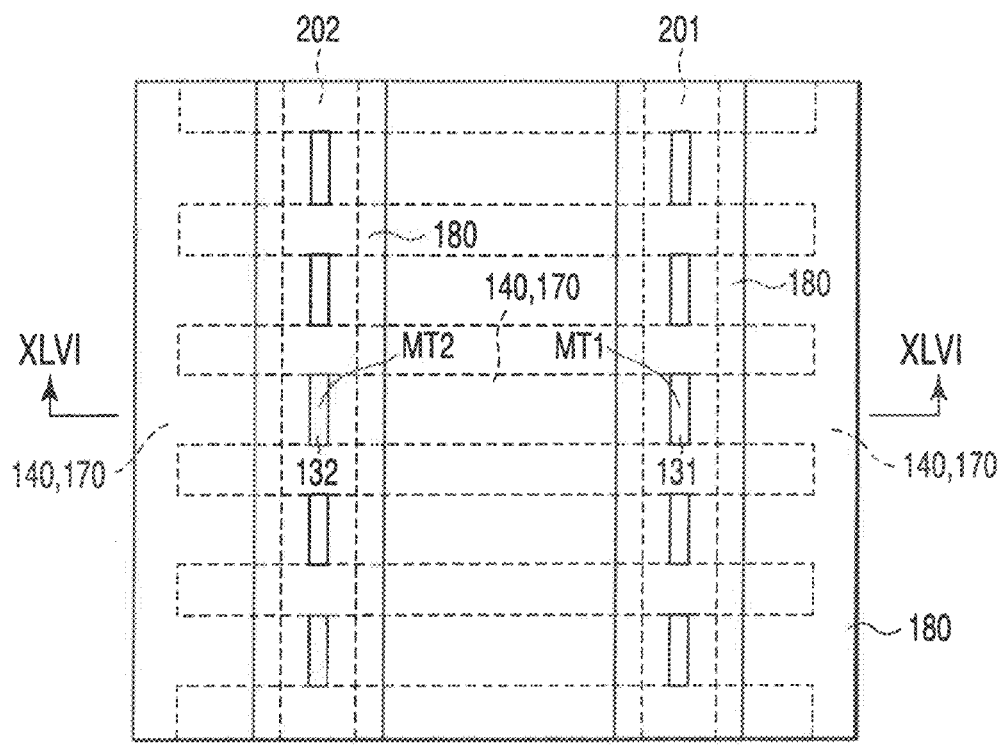
FIG. 46A is a plan view of a step of the manufacturing process according to the second applied example.
Figure 46B:
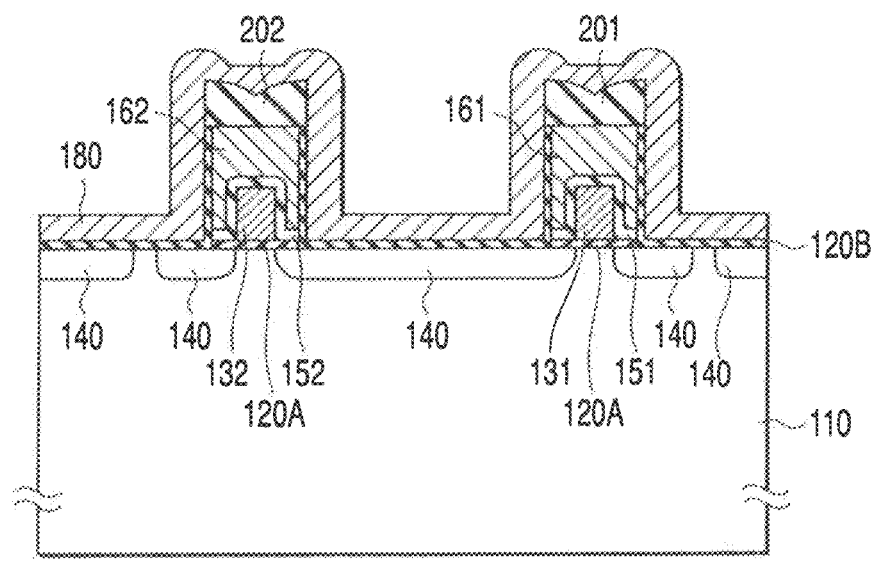
FIG. 46B is a cross-sectional view of the step shown in FIG. 46A of the manufacturing process according to the second applied example.

Next, as shown in FIGS. 46A and 46B, channel implantation is performed in regions in which select transistors are to be formed, and thereafter a gate insulating film 120B is formed by thermal oxidation or the like. Further, a polycrystalline silicon film 180 is formed by CVD or the like.

Figure 47A:
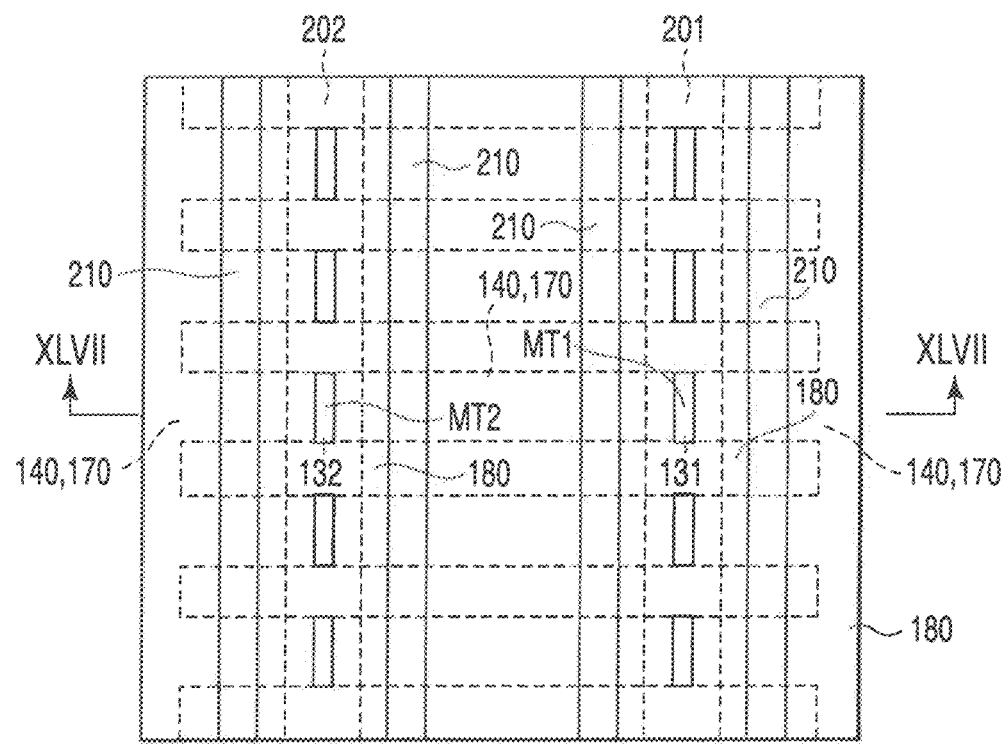
FIG. 47A is a plan view of a step of the manufacturing process according to the second applied example.
Figure 47B:
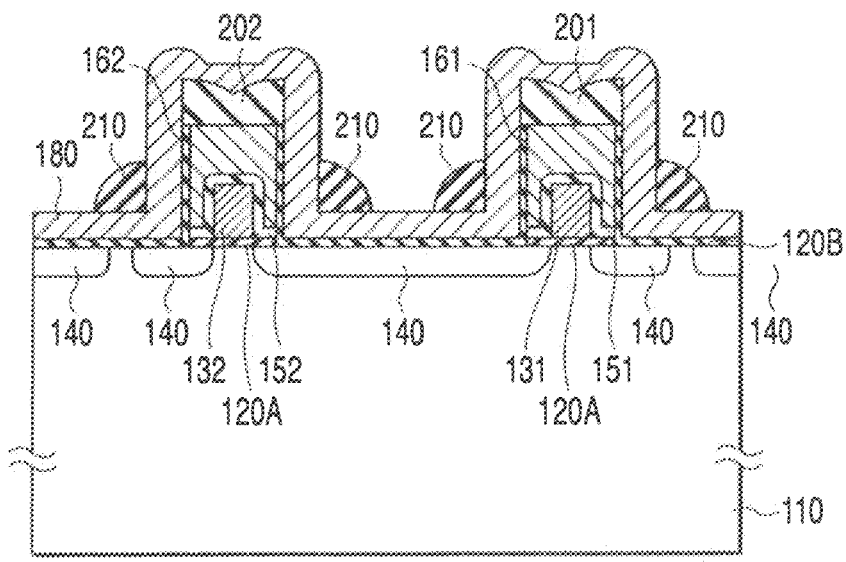
FIG. 47B is a cross-sectional view of the step shown in FIG. 47A of the manufacturing process according to the second applied example.

Next, a silicon oxide film is deposited on the whole surface of the polycrystalline silicon film 180 by CVD or the like, and then etched back. Thereby, as shown in FIGS. 47A and 47B, the silicon oxide film 210 remains on the polycrystalline silicon film 180 on both sides of the memory cell transistors. The silicon oxide film 210 serves as a mask layer when gate electrodes of select transistors are formed.

Figure 48A:
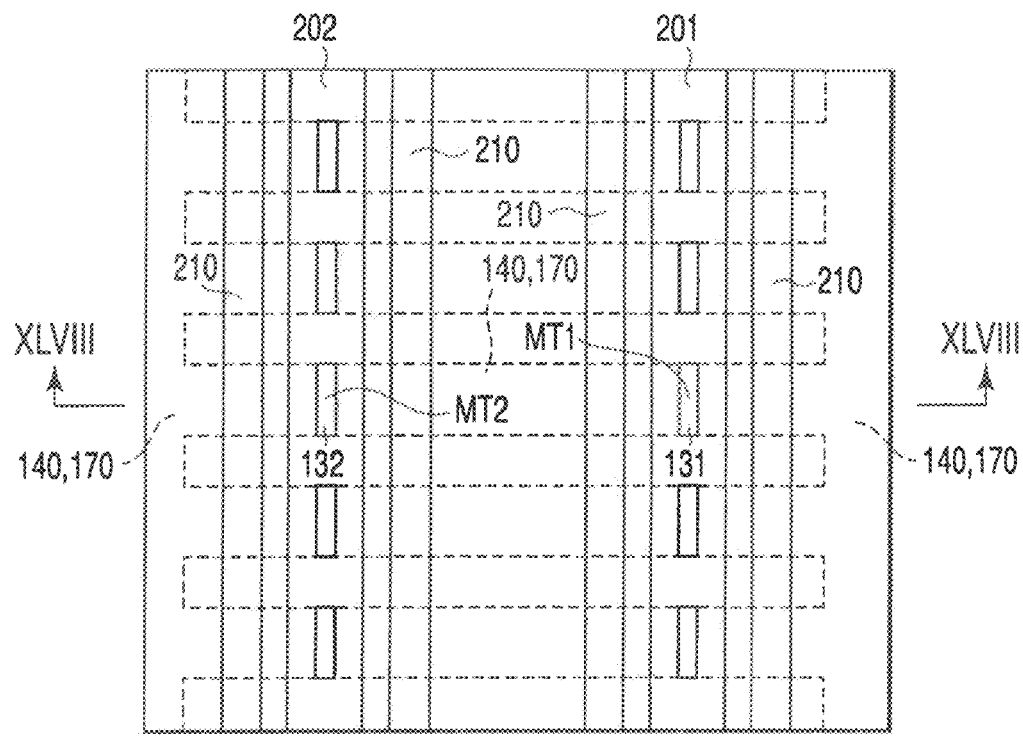
FIG. 48A is a plan view of a step of the manufacturing process according to the second applied example.
Figure 48B:
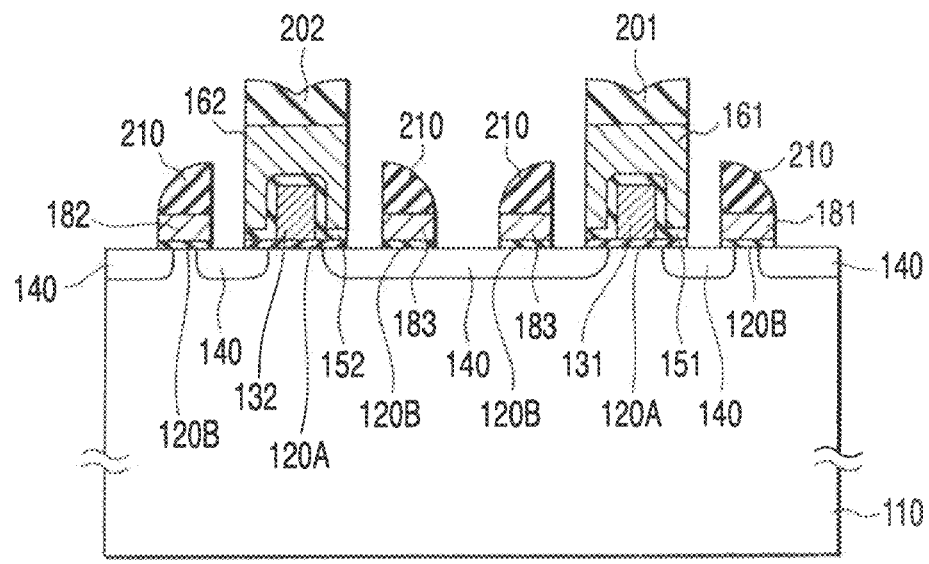
FIG. 48B is a cross-sectional view of the step shown in FIG. 48A of the manufacturing process according to the second applied example.

Thereafter, the polycrystalline silicon film 180 and the gate insulating film 120B are etched, with the silicon oxide film 210 used as a mask. Thereby, as shown in FIGS. 48A and 48B, polycrystalline silicon films 181 to 183 remain under the silicon oxide film 210.

Figure 49A:
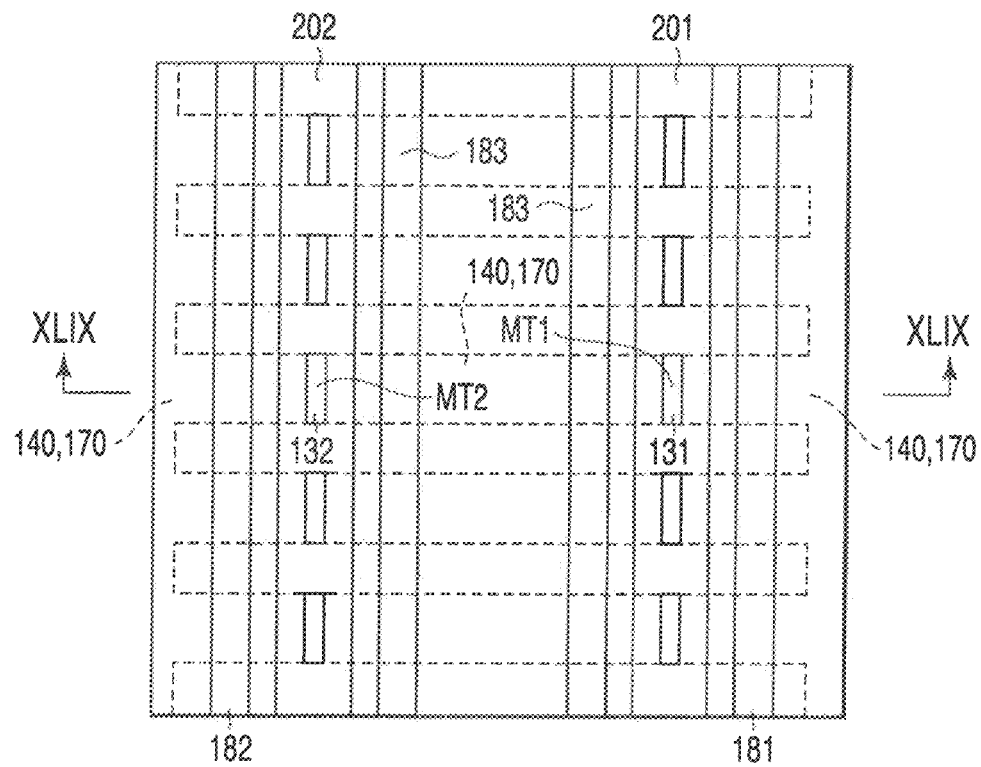
FIG. 49A is a plan view of a step of the manufacturing process according to the second applied example.
Figure 49B:
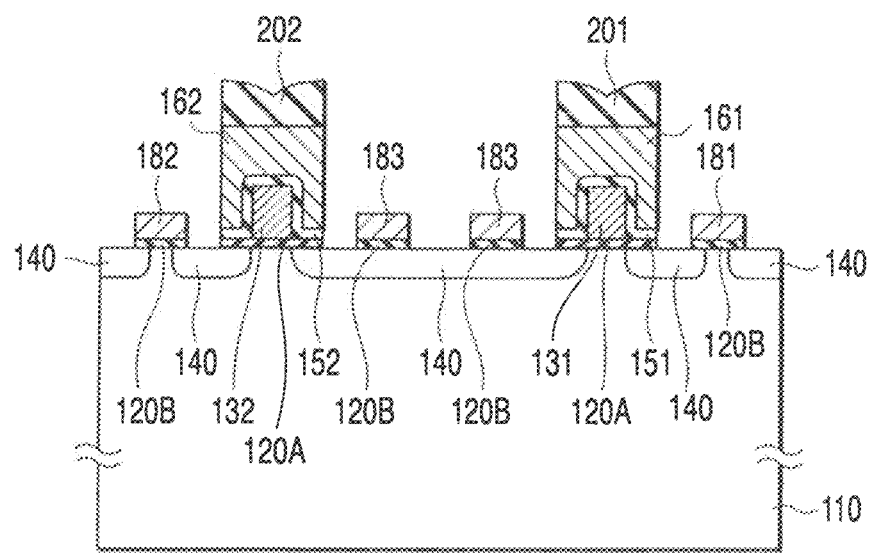
FIG. 49B is a cross-sectional view of the step shown in FIG. 49A of the manufacturing process according to the second applied example.

Next, the silicon oxide film 210 is removed, and thereby a structure shown in FIGS. 49A and 49B is obtained.

Figure 50A:
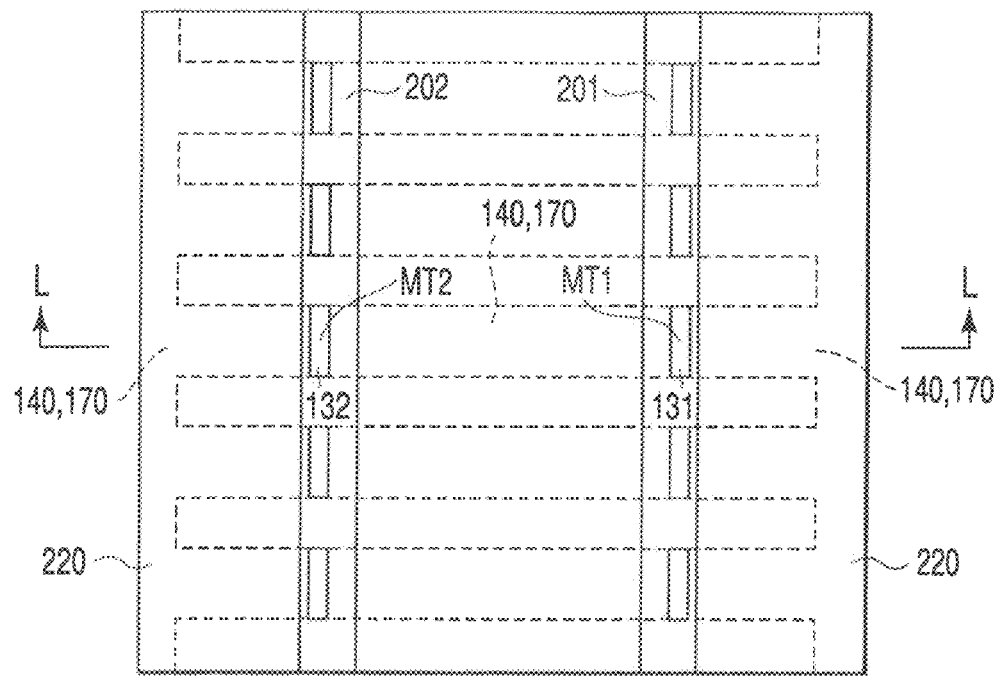
FIG. 50A is a plan view of a step of the manufacturing process according to the second applied example.
Figure 50B:
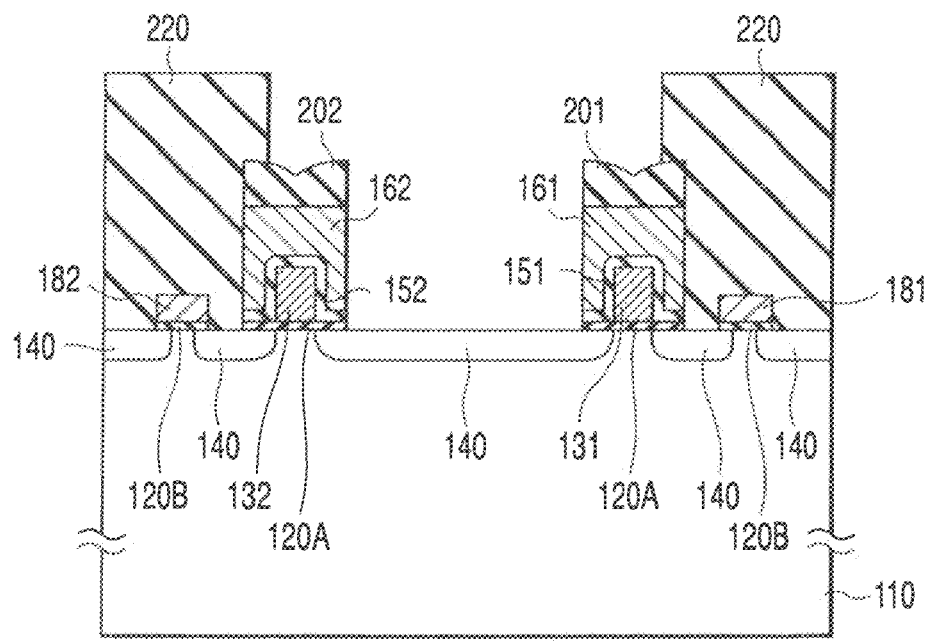
FIG. 50B is a cross-sectional view of the step shown in FIG. 50A of the manufacturing process according to the second applied example.

Then, a resist is applied onto the whole surface of the semiconductor substrate 110, and subjected to patterning to expose the polycrystalline silicon film 183 located between the two memory cell transistors. Then, the polycrystalline silicon film 183 is removed by etching. Thereby, as shown in FIGS. 50A and 50B, the polycrystalline silicon films 181 and 182 remain in the regions outside the memory cell transistors, where the resist 220 serves as a mask.

Then, the resist 220 is removed, and thereby gate electrodes of the select transistors formed of the polycrystalline silicon films 181 and 182 are obtained in a form of being adjacent to the memory cell transistors.

Figure 52A:
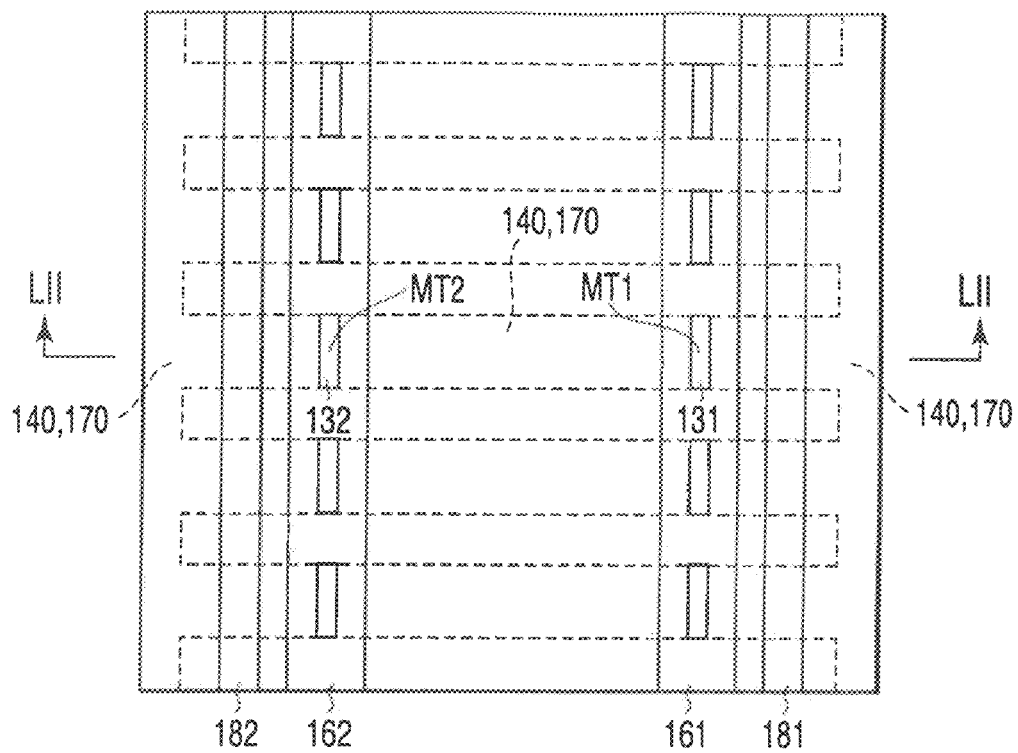
FIG. 52A is a plan view of a step of the manufacturing process according to the second applied example.
Figure 52B:
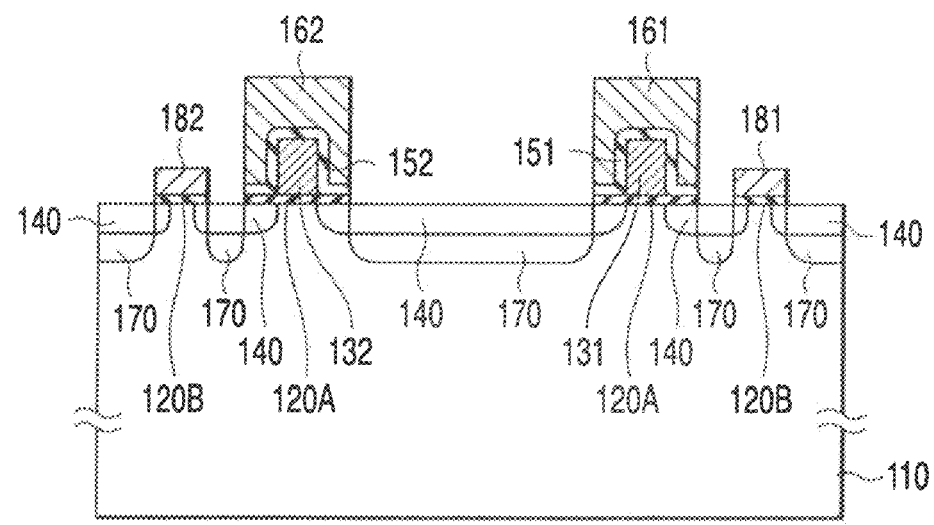
FIG. 52B is a cross-sectional view of the step shown in FIG. 52A of the manufacturing process according to the second applied example.

Then, ion implantation is performed with respect to the whole surface of the semiconductor substrate 110, and the silicon nitride films 201 and 202 are removed. Thereby, as shown in FIGS. 52A and 52B, deep diffusion layer regions (source/drain regions) 170 are formed in a self-alignment manner.

Figure 53A:
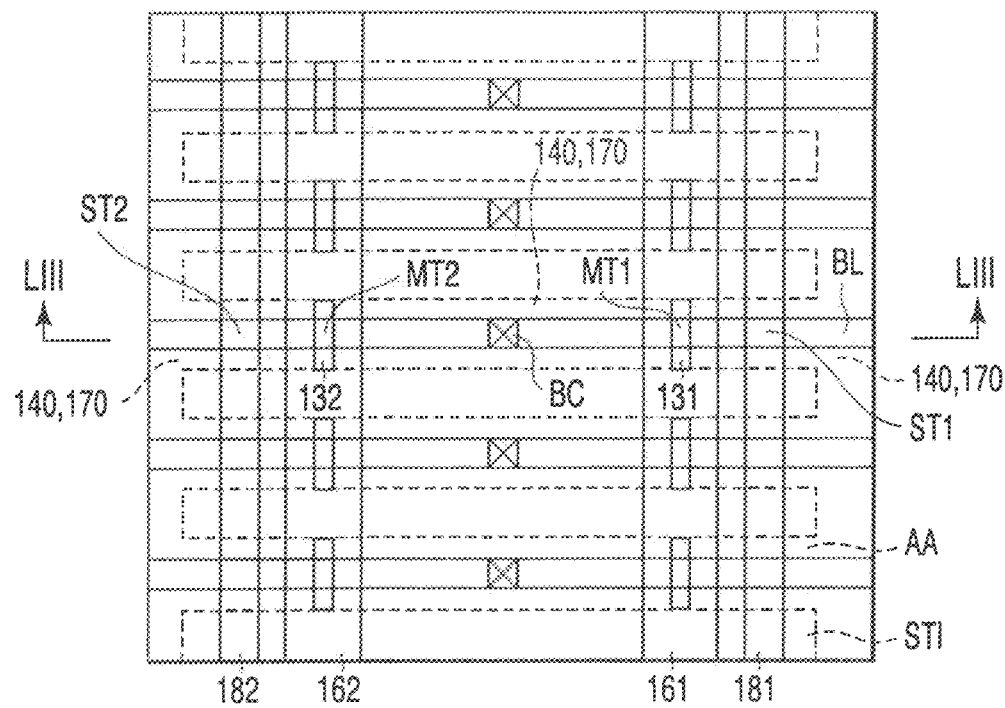
FIG. 53A is a plan view of a step of the manufacturing process according to the second applied example.
Figure 53B:
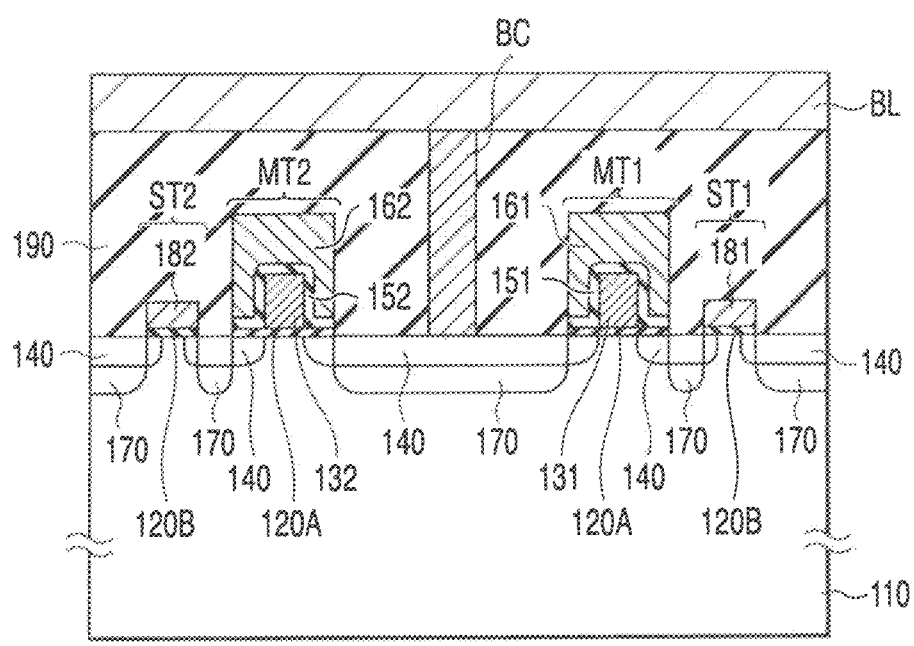
FIG. 53B is a cross-sectional view of the step shown in FIG. 53A of the manufacturing process according to the second applied example.

Next, as shown in FIGS. 53A and 53B, an interlayer insulating film 190 is formed to cover the whole surfaces of the memory cell transistors MT1 to MT2 and the select transistors ST1 and ST2. Thereafter, a bit line contact portion BC is formed in the interlayer insulating film 190 to reach the diffusion layer region located between the memory cell transistors MT1 and MT2. Further, a bit line BL is formed by CVD or the like on the interlayer insulating film 190 to electrically conduct to the bit line contact portion BC. Thereby, the two-transistor flash memory according to the second applied example is finished.

(iii) Conclusion

As described above, the memory cell transistor according to the embodiment of the present invention is applicable to a two-transistor flash memory.

Further, by using the above manufacturing method, a two-transistor flash memory to which the memory cell transistor of the present invention is applied is manufactured by a self-alignment manner, and thereby the manufacturing yield is improved.

3. Others

According to the present invention, the coupling ratio of the memory cell transistor is improved, and thereby the write/erase time is shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile semiconductor memory comprising:
    forming a pattern of a floating gate electrode;
    forming an interelectrode insulating film covering a surface of the floating gate electrode;
    forming a conductive film on the interelectrode insulating film;
    forming an underlayer on the conductive film, the underlayer having a bulging portion above the floating gate electrode;
    forming a first mask layer on the underlayer;
    flattening the bulging portion, and forming a pattern of the first mask layer in a self-alignment manner, the pattern of the first mask layer having a first opening above the floating gate electrode;
    forming a second opening by etching the underlayer, with the first mask layer used as a mask, until the conductive film is exposed;
    forming a second mask layer on the conductive film exposed in the second opening;
    forming a pattern of the second mask layer in the second opening in a self-alignment manner, by etching the second mask layer; and
    forming a control gate electrode by etching the underlayer and the conductive film, with the second mask layer used as a mask.

2. The method of manufacturing a nonvolatile semiconductor memory according to claim 1,
    wherein the underlayer is a silicon oxide layer.

3. The method of manufacturing a nonvolatile semiconductor memory according to claim 1,
    wherein each of the first and second mask layers is a silicon nitride film.

* * * * *